(12) United States Patent
Kaji et al.

(10) Patent No.: US 11,622,464 B2
(45) Date of Patent: Apr. 4, 2023

(54) MODULAR AND CONFIGURABLE ELECTRICAL DEVICE GROUP

(71) Applicant: SELEC CONTROLS PRIVATE LIMITED, Mumbai (IN)

(72) Inventors: Samir Kaji, Mumbai (IN); Raksha Mangal, Mumbai (IN)

( * ) Notice: Subject to any disclaimer, the term of this patent is extended or adjusted under 35 U.S.C. 154(b) by 0 days.

(21) Appl. No.: 17/628,222

(22) PCT Filed: Apr. 15, 2020

(86) PCT No.: PCT/IN2020/050354
§ 371 (c)(1),
(2) Date: Feb. 18, 2022

(87) PCT Pub. No.: WO2021/171300
PCT Pub. Date: Sep. 2, 2021

(65) Prior Publication Data
US 2022/0256724 A1 Aug. 11, 2022

(30) Foreign Application Priority Data
Feb. 24, 2020 (IN) .............................. 202021007721

(51) Int. Cl.
*G06F 1/16* (2006.01)
*H05K 5/00* (2006.01)
(Continued)

(52) U.S. Cl.
CPC ......... *H05K 7/1465* (2013.01); *H05K 7/1481* (2013.01)

(58) Field of Classification Search
CPC .. H05K 7/1465; H05K 7/1481; H05K 7/1467; H05K 7/1468; H05K 7/1464; H05K 7/1462; H05K 7/1474; H05K 7/1482
See application file for complete search history.

(56) References Cited

U.S. PATENT DOCUMENTS 8,121,826 B1 * 2/2012 Neely ................... G06F 30/327
717/109
8,554,972 B2 10/2013 Koch et al.
(Continued)

FOREIGN PATENT DOCUMENTS

CN 107861458 5/2021
WO 1996021179 7/1996
(Continued)

*Primary Examiner* — Anthony M Haughton
(74) *Attorney, Agent, or Firm* — Ifica D. Mehra

(57) ABSTRACT

A modular and configurable group of electrical device group 10 for measurement, control and display of electrical and process parameters comprising a first sub-group 11 and a second sub-group 12; each member comprises either a neck mountable enclosure unit 22 or a base mountable enclosure unit 21, along with a programmable computing receptacle assembly 390 a plurality of function modules 300, a display module 350 and optionally a battery module 380; wherein, a programming and configuration tool 100 is adopted to program and configure each member as an application specific product 23 or as a programmable device 24; an application specific software concentrate 200 drives each member, and is derived from a code generator 250 which converts a PLC compatible programming language 280 into the application specific software concentrate 200 such that an execution time of a "while loop" of the application specific software concentrate 200 is minimal.

23 Claims, 34 Drawing Sheets

(51) Int. Cl.
*H05K 7/00* (2006.01)
*H05K 7/14* (2006.01)

(56) References Cited

U.S. PATENT DOCUMENTS

| | | | | |
|---|---|---|---|---|
| 2001/0047509 A1* | 11/2001 | Mason | ............... | G06F 30/34 716/116 |
| 2004/0106331 A1* | 6/2004 | Hoegener | ............ | H05K 5/0204 439/701 |
| 2006/0136622 A1* | 6/2006 | Rouvelin | ............. | H05K 5/0021 710/62 |
| 2008/0127065 A1* | 5/2008 | Bryant | ................ | G05B 19/056 717/109 |
| 2009/0007058 A1* | 1/2009 | Dharmagadda | ......... | G06F 30/30 717/104 |
| 2009/0307660 A1* | 12/2009 | Srinivasan | .............. | G06F 8/314 717/114 |
| 2012/0043378 A1* | 2/2012 | Vazach | ............... | G06F 9/44505 235/375 |
| 2016/0061468 A1* | 3/2016 | Alexander | ............... | F24F 11/54 700/276 |
| 2019/0029138 A1* | 1/2019 | Dall'Aglio | ........... | H05K 7/1465 |

FOREIGN PATENT DOCUMENTS

| | | |
|---|---|---|
| WO | 2001006388 | 1/2001 |
| WO | 2001071490 | 9/2001 |
| WO | 2003058429 | 7/2003 |
| WO | 2005059697 | 6/2005 |
| WO | 2007018467 | 2/2007 |
| WO | 2008023342 | 2/2008 |
| WO | 2008030700 | 3/2008 |
| WO | 2015104335 | 1/2015 |
| WO | 2015143529 | 10/2015 |
| WO | 2015143533 | 10/2015 |
| WO | 2015174971 | 11/2015 |
| WO | 2016184525 | 11/2016 |

* cited by examiner

| Sr.No. | Variable Name | Variable Type | Datatype | Address | Retention | Initial Value | Description | Modbus Address | Modbus Enable |
|---|---|---|---|---|---|---|---|---|---|
| 1 | Var1 | VAR_INPUT | USINT | %IB0 | Yes | 1 | | 40000 | Yes |
| 2 | Var2 | VAR_INPUT | USINT | %IB1 | Yes | 2 | | 40001 | Yes |
| 3 | Var3 | VAR_INPUT | USINT | %IB2 | Yes | 3 | | 40002 | Yes |
| 4 | Var4 | VAR_INPUT | USINT | %IB3 | Yes | 4 | | 40003 | Yes |
| 5 | Coil1 | VAR_TEMP | BOOL | %MX0 | Yes | | | 512 | Yes |
| 6 | Coil2 | VAR_TEMP | BOOL | %MX1 | Yes | | | 513 | Yes |

| LadderID | GV | | | | | | | | |
|---|---|---|---|---|---|---|---|---|---|
| Sr No | Variable Name | Variable Type | Datatype | Address | Retention | Initial Value | Description | Modbus Address | Modbus Enable |
| 1 | SLAVE_ID | VAR_INPUT | UINT | %IW0 | ☐ Yes | 1 |  | 40768 | ☑ Yes |
| 2 | SOURCE_ADDRE | VAR_INPUT | UINT | %IW1 | ☐ Yes | 0 |  | 40769 | ☑ Yes |
| 3 | LENGTH | VAR_INPUT | UINT | %IW2 | ☐ Yes | 4 |  | 40770 | ☑ Yes |
| 4 | DESTINATION_AE | VAR_INPUT | UINT | %IW3 | ☐ Yes | 8#B0 |  | 40771 | ☑ Yes |
| 5 | SCAN_RATE | VAR_INPUT | UINT | %IW4 | ☐ Yes | 10 |  | 40772 | ☑ Yes |
| 6 | COMM_ERR | VAR_OUTPUT | USINT | %QM0 | ☐ Yes |  |  | 30768 | ☑ Yes |
| 7 | DestVar1 | VAR_INPUT | USINT | %IB0 | ☐ Yes |  |  | 40000 | ☑ Yes |
| 8 | DestVar2 | VAR_INPUT | USINT | %IB1 | ☐ Yes |  |  | 40001 | ☑ Yes |
| 9 | DestVar3 | VAR_INPUT | USINT | %IB2 | ☐ Yes |  |  | 40002 | ☑ Yes |
| 10 | DestVar4 | VAR_INPUT | USINT | %IB3 | ☐ Yes |  |  | 40003 | ☑ Yes |

Figure 11F

| Sr No | Variable Name | Variable Type | Datatype | Address | Retention | Initial Value | Description | Modbus Address | Modbus |
|---|---|---|---|---|---|---|---|---|---|
| 1 | SLAVE_ID | VAR_INPUT | UINT | %IW0 | ☐ Yes | 1 | | 40768 | ☑ Yes |
| 2 | SOURCE_ADDRES | VAR_INPUT | UINT | %IW1 | ☐ Yes | 0 | | 40769 | ☑ Yes |
| 3 | LENGTH | VAR_INPUT | UINT | %IW2 | ☐ Yes | 4 | | 40770 | ☑ Yes |
| 4 | DESTINATION_ADD | VAR_INPUT | UINT | %IW3 | ☐ Yes | &I80 | | 40771 | ☑ Yes |
| 5 | SCAN_RATE | VAR_INPUT | UINT | %IW4 | ☐ Yes | 10 | | 40772 | ☑ Yes |
| 6 | COMM_ERR | VAR_OUTPUT | UINT | %QW0 | ☐ Yes | | | 30768 | ☑ Yes |
| 7 | DestVar1 | VAR_INPUT | USINT | %IB0 | ☐ Yes | | | 40000 | ☑ Yes |
| 8 | DestVar2 | VAR_INPUT | USINT | %IB1 | ☐ Yes | | | 40001 | ☑ Yes |
| 9 | DestVar3 | VAR_INPUT | USINT | %IB2 | ☐ Yes | | | 40002 | ☑ Yes |
| 10 | DestVar4 | VAR_INPUT | USINT | %IB3 | ☐ Yes | | | 40003 | ☑ Yes |
| 11 | COIL_SOURCE_AD | VAR_INPUT | UINT | %IW5 | ☐ Yes | 512 | | 40773 | ☑ Yes |
| 12 | COIL_LENGTH | VAR_INPUT | UINT | %IW6 | ☐ Yes | 2 | | 40774 | ☑ Yes |
| 13 | COIL_DA | VAR_INPUT | UINT | %IW7 | ☐ Yes | &MX0 | | 40775 | ☑ Yes |
| 14 | COIL_COMM_ERR | VAR_OUTPUT | UINT | %QW1 | ☐ Yes | | | 30769 | ☑ Yes |
| 15 | DestCoil1 | VAR_TEMP | BOOL | %MX0 | ☐ Yes | | | 512 | ☑ Yes |
| 16 | DestCoil2 | VAR_TEMP | BOOL | %MX1 | ☐ Yes | | | 513 | ☑ Yes |
| 17 | EN_PSR | VAR_TEMP | BOOL | %MX2 | ☐ Yes | | | 514 | ☑ Yes |
| 18 | PSR_SA | VAR_INPUT | UINT | %IW8 | ☐ Yes | 0 | | 40776 | ☑ Yes |
| 19 | PSR_Var1 | VAR_INPUT | USINT | %IB4 | ☐ Yes | 100 | | 40004 | ☑ Yes |
| 20 | PSR_MA | VAR_INPUT | UINT | %IW9 | ☐ Yes | &IB4 | | 40777 | ☑ Yes |
| 21 | PSR_ERR | VAR_OUTPUT | UINT | %QW2 | ☐ Yes | | | 30770 | ☑ Yes |
| 22 | EN_FSC | VAR_TEMP | BOOL | %MX3 | ☐ Yes | | | 515 | ☑ Yes |
| 23 | FSC_SA | VAR_INPUT | UINT | %IW10 | ☐ Yes | 512 | | 40778 | ☑ Yes |
| 24 | FSC_MA | VAR_INPUT | UINT | %IW11 | ☐ Yes | &MX4 | | 40779 | ☑ Yes |
| 25 | FSC_Coil1 | VAR_TEMP | BOOL | %MX4 | ☐ Yes | | | 516 | ☑ Yes |
| 26 | FSC_ERR | VAR_OUTPUT | UINT | %QW3 | ☐ Yes | | | 30771 | ☑ Yes |

MODULAR AND CONFIGURABLE ELECTRICAL DEVICE GROUP

FIELD OF THE INVENTION

The present invention relates to electrical devices, particularly modular electric devices, and more particularly modular electric devices deployed for controls and are configurable for control functions.

BACKGROUND OF THE INVENTION

Electrical devices deployed for measurement, protection and control are in abundance since quite some time and at present times. Progressively, the functions that such electrical devices can perform are exponentially increasing.

Let us understand this aspect with a temperature scanner, which is a relatively simple and one of the several possible illustrative products. Temperature Scanners generally monitor temperature of more than one point in a process. Through a configured program, temperature of each point is scanned in rotation and displayed. Optionally, either a common display with separate channel, or a zone indication control action is provided as programmed. Other options such as Printer Interface are provided as required. Temperature settings are done either by keypad or by set of thumb wheel switches. Scan time is settable between 0.1 see per channel to 8.99 sec per channel, with a default setting of say 1 sec. Through a Skip function, a particular Channel function is not scanned. The temperature scanner unit is housed in a suitable DIN standard cabinet. Such units are obviously suitable for a fixed group of inputs and outputs.

There are uncounted such devices deployed in any industrial process which require any and many of the following illustrative but non-exhaustive inputs/outputs:
- 2 or 4 or 6 or more digital inputs, 5 to 30V PNP type or NPN type, with or without Isolation, Response time<1 ms or suitable for up to 5 KHz, and higher frequency response times through supplemented intelligence; and or
- 2 or 3 or 4 or more relay Outputs, SPST or SPDT, 5 A @ 250V (Resistive), Electrical life of the order of 1,00,000 operations and or Mechanical life of the order of 20,00,000 operations; and or
- 2 or 3 or 4 or more Transistor Output—24 VDC, 100 mA, PNP or NPN, Short circuit protected, some or all of the Transistor Outputs be configured as Fast Outputs up to 5 KHz, and higher frequency response time through supplemented intelligence; and or
- 2 or 3 or 4 or more channel Analog Temperature input—PTC and or NTC and or RTD type, of specified Accuracy and or conversion time; and or
- 2 or more channel Analog input, -1V to 10V or more (like solar DC input can be up to 100V to 1000V), and or 0 to 20 mA, and or 4 to 20 mA, of specified accuracy and or conversion time; and or
- 1 or 2 or more channel Analog Output, 0 to 10V or more and or 0 to 20 mA or more, and or 4 to 20 mA, of specified accuracy and or conversion time; and or
- 2 or more channel Load Cell Input for weighing application; and or
- Customized circuit assemblies for a combination, illustratively a digital input, a thermo-couple analogue input, a fast response input, a fast response output, and or special function input/output, user defined I/O card etc; and or
- Ac inputs 1 to 3 phase—voltage & current; and or
- CT AC current input; and or
- Data-logging card with requisite memory with SPI port communication, RTC and Battery; and
- in requisite mounting provision including flush mounting and or projection mounting!

It is clear that above options amount to an exceedingly large number of physically different products with even larger number of configuration possibilities.

There are higher end PLCs known, however they fail to meet this requirement economically. Also, such products are bulkier and slower in response, and intrinsically less robust! Present invention addresses this pertinent industrial requirement.

OBJECTIVES

The objective is to invent a group of electrical devices that are suitable for accommodating different combinations of function modules namely input modules, output modules, display modules, battery modules, temperature modules, and so on.

Another objective is to invent a group of configurable electrical controlling devices that have response time comparable to factory-built or standard products.

Another objective is to invent a group of configurable electrical devices that mechanical and electronic reliability comparable to factory-built or standard products.

Another objective is to invent a group of electrical devices that are configurable.

Yet another objective is to invent a group of electrical devices that are mountable on a door or a base or a combination.

Yet another objective is to invent a group of electrical devices that are used individually as well as in combination.

Yet another objective is to invent a group of electrical devices which ensure fail proof connection and disconnection of electrical circuit of function modules.

Yet another objective is to invent a group of electrical devices that have common critical modular parts.

Yet another objective is to invent a group of electrical devices that have secure placement of critical modular parts.

Yet another objective is to invent a group of electrical devices that are package-able in different unit sizes commensurate with application.

SUMMARY OF THE INVENTION

The present invention is a group of electrical devices, the group comprises a first sub-group of electrical devices and a second sub-group of electrical devices.

Each member of electrical device of the first sub-group comprises a base mountable enclosure unit, a programmable computing receptacle assembly and at least one function module. Each member of electrical device of the second sub-group comprises a neck mountable enclosure unit, a programmable computing receptacle assembly and at least one function module.

Function modules cater to a variety of process linked functions, a non-exhaustive list being:
- digital inputs of various types, with or without Isolation, of different response times
- relay outputs, with different mechanical and electrical ratings
- transistor output, of different ratings, with different protections and output speed analog temperature input—PTC and or NTC and or RTD type and or TC type, of specified Accuracy and or conversion time analog input, −1V to 10V or more, and or 0 to 20 mA or more, and or 4 to 20 mA, of specified accuracy and or conversion time analog output, 0 to 10V and or 0 to 20 mA, and or 4 to 20 mA, of specified accuracy and or conversion time load cell Input for weighing application special function module, illustratively—data-logging, Ethernet, wifi module, USB module AC input, CT input Special purpose module, Combination module For each function, the electronic circuitry is different, architectured in a common mechanical design and electrical connectivity.

Each member of the group of electrical device has a display module and optionally a battery module. The display module has a variety of sizes and kind of electrical display component, and one of the possibilities is having no display component.

Each member of electrical device of the first sub-group and the second sub-group is an independently configurable application specific electrical control device.

Each member of electrical device of the first sub-group and the second sub-group is a configurable application specific electrical control device as a slave or a master, in combination to a plurality of members of electrical device of the first sub-group and the second sub-group of electrical devices. Resultantly, a most optimum equipment layout of electrical devices on a base and a panel door of any electrical cubicle is producible, as a ready-to-use product or as a programmable device.

Each member of the group of electrical devices comprises the programmable computing receptacle assembly, a plurality of function modules, a display module, and optionally a battery module. The programmable computing receptacle assembly comprises a plurality of circuit boards having at least a micro-controller with associated electronic circuitry, has a plurality of set of plug-in female electrical connectors, a set of plug-in male connectors, a set of wire-able connectors and an optional battery cell connector. The micro-controller is also termed as a uC, interchangeably.

In a preferred embodiment, the programmable computing receptacle assembly comprises a circuit board assembly having at least a micro controller with the associated electronic circuitry, a plurality of set of plug-in female electrical connectors, a set of plug-in male connectors, a set of wire-able connectors, an optional battery cell connector, and a set of minimal controlling means. The set of minimum controlling means have:

(a) a plurality of input points and a plurality of output points in a prescribed combination, and
(b) an ambience sensing point, and
(c) a plurality of communication transceiver.

The programmable computing receptacle assembly further comprises
at least one type A module receptacle, and or
at least one type B module receptacle, and or
a plurality of type C module receptacle and or type D module receptacle in the second members, the third members and so on, and
a display module receptacle.

Each of the type A module receptacle, the type B module receptacle, the type C module receptacle, and the module D module receptacle has identical numbers of electrical connecting points on the set of plug-in female electrical connector. The current embodiment has twelve electrical connecting points; however the present invention is not limited thereto.

The product or the programmable device having the set of minimum controlling means, the type A, the type B, the type C and the type D module receptacle is arrived at differently for different members of the group of electric device, based on understanding of industry requirement of application specific control products, and a balance between a physical packaging, the capacity of the micro controller of the programmable computing receptacle assembly, and cost.

Person skilled in the art well appreciate that since each type of module receptacle corresponds to a different electrical schematic, these receptacles are mechanically identical but electrically different. In order to meet the objective of being able to plug in different kinds of function modules, present invention ensures a harmonization between different receptacles such that the function module suited to functions of the type D module receptacle can also be disposed in the type C module receptacle, also in the type B module receptacle and also in the type A module receptacle. Note: As an exception, where the type D module may have extended number of connecting pins like 24 pin for Ethernet, it may not be possible to plug the type D module in the type A, type B or type C module receptacle.

the function module suited to functions of the type C module receptacle can also be disposed in the type B module receptacle, also in the type A module receptacle.

Persons skilled in the art know that process parameters are large in number and dictate cost of the programmable device or product. It is also known that process parameters vary at relatively different real time and different rate. While few process parameters need to be communicated and processed, in other words responded to, at the rate of 1 to 20 kHz or more, a large number are optimally managed at a relatively lesser response time. Still fewer require faster frequency of response too. Numbers of ports on any micro-controller are limited primarily due to a physical constraint.

In the present invention, an effective number of ports of the micro-controller are expandable by providing on the function module
on the function module, a barrel shifter communicating with two ports of the micro-controller, and extendible up to 16 digital inputs/16 transistor outputs by cascading the barrel shifter;
on the function module, a slave intelligence (a slave micro-controller), communicating with two ports of the micro-controller by a serial interface interfacing;
outside (external to) the function module, a driving module, comprising a receiver with a driver to drive a final element, like a contactor or a relay. The driving module is independently disposable in an enclosure.

Such software aided ports have optimal response time and are a cost-effective solution.

In the preferred embodiment of the present invention, the function module has six allotted ports of the uC, the invention is, however, not limited by above alternatives, nor number of ports.

Need based, a user selects, from the group of electrical devices, one or more member(s) of electrical device of either of the first sub-group or the sub-group, and if needed, one or more member(s) of either of the subgroup or the second sub-group, and one or more function modules and a display module and optionally a battery module. In applications needing two members of electrical devices in combination as a master member and a slave member, then an RS485 port of the master member and an RS485 port of the slave member are connected.

The present invention of group of electrical devices facilitates virtually unlimited permutations and combinations in mechanical form factor without compromising reliability and functional efficiency of each member which is same as or higher than an industrially produced application specific product, also known as a standard product or a factory-built product.

An application specific software concentrate, which is essentially an application specific firmware, is producible as per present invention by which an applicable configured product executes a set of desired functions. The application specific software concentrate is derived from a code generator which converts a PLC compatible programming language into the application specific software concentrate. Term "programming language" includes Ladder, FBD, SFC, and any custom-built Instruction set. (IL)

The application specific software concentrate is an abridged firmware which is converted to a direct executable instruction set for the product microcontroller, & hence the program runs with optimum speed for any functionality; wherein functionalities unwanted in the applicable configured product are suppressed while a prioritized functionalities are configured to run with an interrupt service routine code (ISR). Consequently, an execution time typical of the PLC compatible programming language gets cut significantly and becomes of the order of a tailor-made product, also known as a factory-built product or a standard product. Note that here, primarily the speed is achieved due to direct uC instruction set; additionally, & alternatively, certain functions can be configured to run in an ISR which is optional.

The member of the group of electrical devices as per present invention is executed by the application specific software concentrate which derived from the code generator wherein the PLC compatible programming language gets abridged which is converted to a direct executable instruction set for the product microcontroller, & hence the program runs with optimum speed for any functionality; wherein functionalities unwanted in the applicable configured product are suppressed while a prioritized functionalities are configured to run with an interrupt service routine code (ISR). Consequently, an execution time typical of the PLC compatible programming language gets cut significantly and an execution time of the application specific software concentrate becomes of the order of the prior art counter.

The code generator is a proprietary software of "SELEC Controls Private Limited, India", which is capable of creating an executable file in C or C++ or contemporary computer language and comprises software elements including:

1) uC Drivers/Peripheral drivers
2) IO Card configuration functions, as if they are attached to a controller directly
3) Application specific ISR functions
4) User Application programming language (Ladder, FBD, ST, IL) logic
5) HMI Pages for user configuration encompassing an entire user interface The output of the code generator is an equivalent code of a target Standard Product. The code generator is architectured such that it derives the desired code as per Input/output (I/O) card selected & creates a function (say SetPortFunctions( ), which directly sets the port functions as per desired functionality at power up. It also adds/creates respective Peripheral & ISR files that will be needed for application functionality (like Capture ISR). The code generator updates & reads the IO card status at its direct port as if it is fixed IO configuration up to a single I/O as a smallest possible configuration.

Since each member of electrical device of the first sub-group as well as the second sub-group is essentially producible by picking and assembling from a large variety of function modules, it is important to ensure that mechanical and electrical modularity are interdependently robustized. The present invention addresses this aspect as explained now. There are likely situations where a user has configured a slot of the member of the group of electrical device 10 which is to be configured for 5 digital inputs but has not inserted a corresponding function module. Also, there are likely situations where a user has configured the slot for the member under configuration for 5 digital inputs but has actually connected less than 5 digital inputs for the time being. Persons skilled in the art are well aware that any open port of any controller generally leads to nuisance operation or product malfunction consequent to instability of such connected controller—for, the controller gets into an undeterministic state, either hangs or resets. In a standard product or factory-built product, such unused uC ports are protected against nuisance operation by way of a hardware solution through a pull-up or pull-down resistor which permanently pulls up or pulls down an unused port.

The members of the group of electrical devices as per present invention have a card detect circuitry disposed at a pre-designated port of the micro-controller for each slot. In the event that the input module is not inserted, the card detect circuitry maintains a high input at the micro-controller port. Consequently, the micro-controller gets an instruction to force and set all its unused ports to OUTPUT mode periodically in a loop time less than one millisecond. This inventive solution retains the possibility of using any unused input port at a later date. Each function module has a pull down resistor at a pin corresponding to the pre-designated port of the micro-controller, so that when the function module is detected the micro-controller does NOT intervene.

It is to be noted that setting an unused port to OUTPUT mode once or at intervals longer than 2 milliseconds does NOT adequately address the issue of nuisance operation and this method of periodic setting is an integral part of the present invention.

Each member of electrical device of the first sub-group as well as the second sub-group auto detects a presence of the display module, auto detects the display module physically connected, and verifies a hardware of the display module with a display module configuration entered. In situations where the display module connected is different than the display module configured then an error message is generated, displayed on the connected display module and or communicated via a communication port, which is generally a serial communication port like UART port.

For the functional module having an analog input and or an analog output, there is provided an amplification circuitry wherefor an offset calibration parameter and a gain calibration parameter resides in a local eeprom present on the function module. In the preferred embodiment, there are 6 allotted ports of the uC on the function module, 3 of which are engaged for an $i^2c$ communication between Main micro-controller & the local eeprom. The application specific software concentrate auto-configures the ports & the function module functions accordingly. The i²c communication uses a known bit-banging method and consequently microcontroller's i²c peripheral requirement is eliminated. At power ON, after detecting a presence of the function module with the analog input and or the analog output, the microcontroller reads the offset calibration parameter and the gain calibration parameter residing in the local eeprom & saves in its random access memory. The application specific software concentrate applies a calibration check that the offset calibration parameter and the gain calibration parameter are within a prescribed range. In the event that the calibration check fails, which could be due to an eeprom failure/corruption or inappropriate calibration data or no calibration data present or any other reason, then a predecided calibration values are considered and a calibration fault flag is generated on the display module and/or read via a data communication.

Since the members of the electrical device are configurable and deployed in wide applications, it is imperative that errors or defects creep in field conditions and the present invention addresses such eventualities.

A programming and configuration tool in the form of a computer program, named "SELPRO" is deployed to program and configure the programmable computing receptacle assembly. The programming and configuration comprises the gross steps of:
Selecting a product from a drop down menu "New Project"
Selecting function modules
Creating a ladder diagram for a control logic of respective function modules
Simulating an execution of the ladder diagram
Customizing a user interface from a generic interface The member of group of electrical devices is a wireless communication capable programmable device wherein the function module having a commensurate communication capability (WiFi and or Ethernet and or USB) is inserted in the type D module receptacle which is adapted to accommodate such function module.

As a variation, a wireless programmable computing receptacle assembly has the commensurate communication capability, whence the member of group of electrical devices is a wireless communication capable product.

The wireless communication capable programmable device and the wireless communication capable product interfaces with a contemporary smart phone or a PC/Server for a wireless management of
Variable data, configuration parameters, display parameters
Mail, SMS and such data as per set configuration
Executable files Since the product and the programmable device as per present invention is hugely modular and configurable, a plurality of measures are built-in to safeguard the group of electrical devices against inappropriate assembly, unauthorized disassembly and tamper.
Connecting of the function module with the programmable computing receptacle assembly, housed in a base mounted enclosure unit or a neck mounted enclosure unit, is enabled only in one permissible manner ensuring that a set of plug-in male electrical connectors of the function module precisely engages till a defined depth with a corresponding set of plug-in female electrical connector on the programmable computing receptacle assembly.
Connecting the display module with the programmable computing receptacle assembly, housed in a base mounted enclosure unit or a neck mounted enclosure unit, is enabled only in an engaging orientation ensuring that a plug-in female electrical connector of the display module precisely engaging till a defined depth with a corresponding set of plug-in male electrical connector on the programmable computing receptacle assembly.
Connecting the battery module with the programmable computing receptacle assembly, housed in a base mounted enclosure unit or a neck mounted enclosure unit, is permissible only when a polarized module cover is aligned with a corresponding seat, ensuring thus ensuring that a first contact surface and the second contact surface makes an electrical contact with a battery cell connector on the programmable computing receptacle assembly with a requisite contact pressure.
Removing or replacing the function module involves an untrapping of the frontal locking means of the function module, wherein the untrapping of the frontal locking means is by a fine edge screwdriver or an equivalent sharp tool. For situations where the removing or replacing the function module is a supervisory function, the fixation cap has a pair of safety slots, and the untrapping is by a fork type screwdriver. As yet another embodiment, the untrapping is by a fork type tool with an untrapping profile complementary to a safety profile provided on the fixation cap of the function module 300.
Multi-level auto-expiring numeric/alpha-numeric passwords, retrievable from graphic user interface or from manufacturer when forgotten.

The member of the first sub-group and the member of the second sub-group, of the modular and configurable electrical device group as per present invention is branded as MBRX

BRIEF DESCRIPTION OF DRAWINGS

FIG. 11A to FIG. 11H are screen images of a programming and configuration tool in the form of a computer program, named "SELPRO".

DETAILED DESCRIPTION OF INVENTION

Present invention is described with the help of accompanying drawings. The invention has a wide application, and the explanation and illustrations should not be construed to limit the invention in any manner whatsoever.

Figure 1:
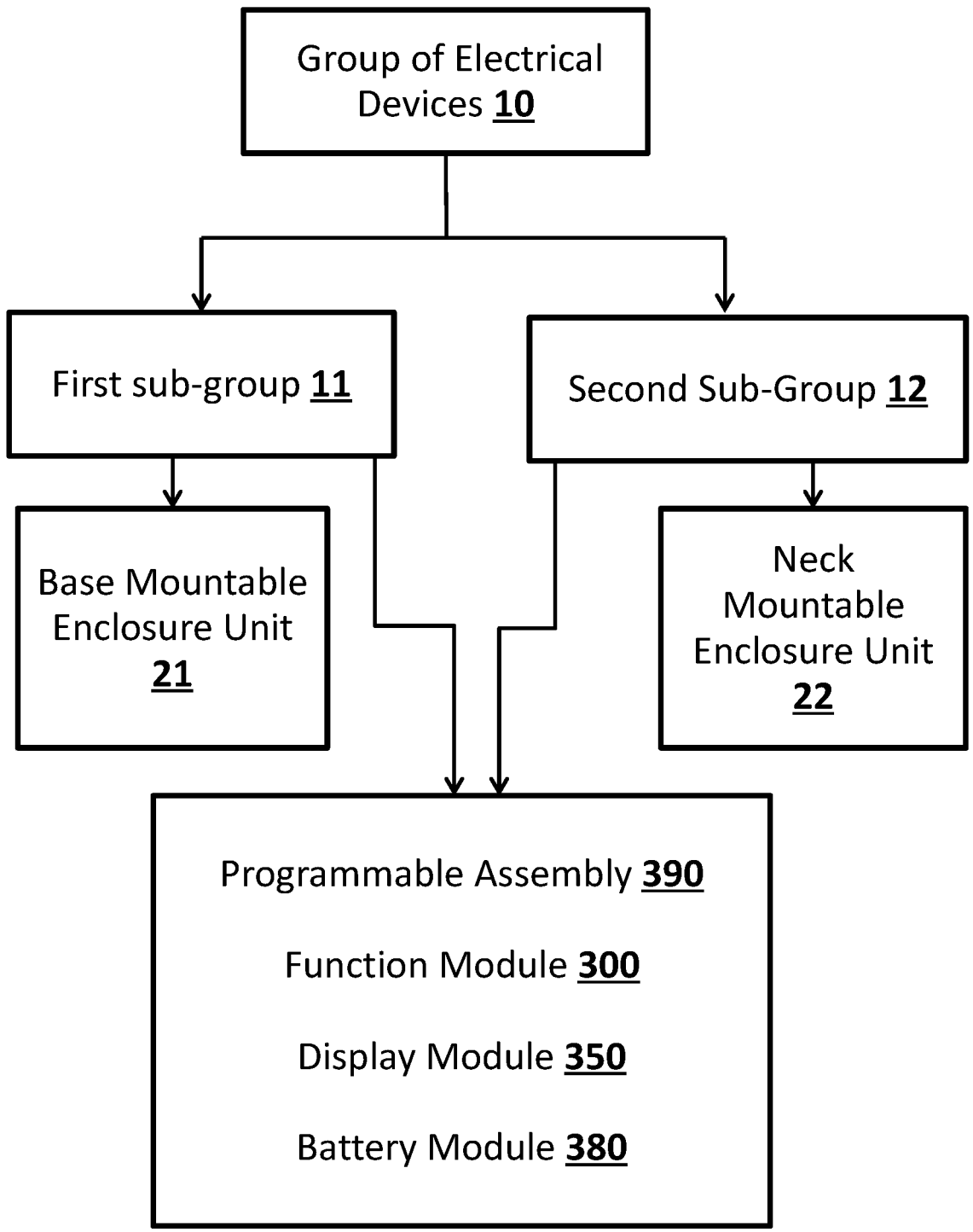
FIG. 1 is a block diagram giving constituents of a group of electrical devices as per present invention.

FIG. 1, the present invention is a group of electrical devices 10. The group comprises a first sub-group of electrical devices 11 and a second sub-group of electrical devices 12.

Table below is an illustration to get a generic understanding of the products and product applications that present invention addresses in the first sub-group 11 and the second sub-group 12:

trical device of the second sub-group 12 accommodates at least one function module 300. A second member of electrical device of the second sub-group 12 accommodates at least four function modules. A third member of electrical device of the second sub-group 12 accommodates at least six function modules, and so on.

Function modules 300 cater to a variety of process linked functions, a non-exhaustive list being:
  digital inputs of various types, with or without Isolation, of different response times
  relay outputs, with different mechanical and electrical ratings
  transistor output, of different ratings, with different protections and output speed
  analog temperature input—PTC and or NTC and or RTD type and or TC type, of specified Accuracy and or conversion time
  analog input, −1V to 10V or more, and or 0 to 20 mA or more, and or 4 to 20 mA, of specified accuracy and or conversion time
  analog output, 0 to 10V and or 0 to 20 mA, and or 4 to 20 mA, of specified accuracy and or conversion time
  load cell Input for weighing application
  special function module, illustratively—data-logging, wifi module, USB module
  AC input, CT input
  Special purpose module, Combination module For each function, the electronic circuitry is different, architectured in a common mechanical design and electrical connectivity.

| Sub-group | Minimum I/O Configuration | Maximum I/O Configuration | Typical Product Applications |
|---|---|---|---|
| First sub-group 11 | 3 digital inputs including 2 high speed inputs | 15 to 20 I/Os | Transducer, Logger, Lower end customized timer, counter, logic patterns Control & monitoring of different sensors & actuators |
| | 5 digital including 2 high speed inputs and 1 analogue input | 25 to 30 I/Os | Control & monitoring of industrial applications, Production automation & control |
| | 10 digital inputs including 2 high speed inputs, 2 analogue inputs + 4 relay outputs | 40 to 45 I/Os | Higher end industrial processes |
| Second sub-group 12 | 4 digital inputs including 2 high speed inputs and 1 analogue input | 40 to 45 I/Os | |
| | 4 digital inputs including 2 high speed inputs d 1 analogue input + 3 relay outputs | 15 to 20 I/Os | Applications with combination of timer, counter, and or temperature |
| | 6 digital inputs including 2 high speed inputs and 1 analogue input | 15 to 20 I/Os | |

Figure 2:
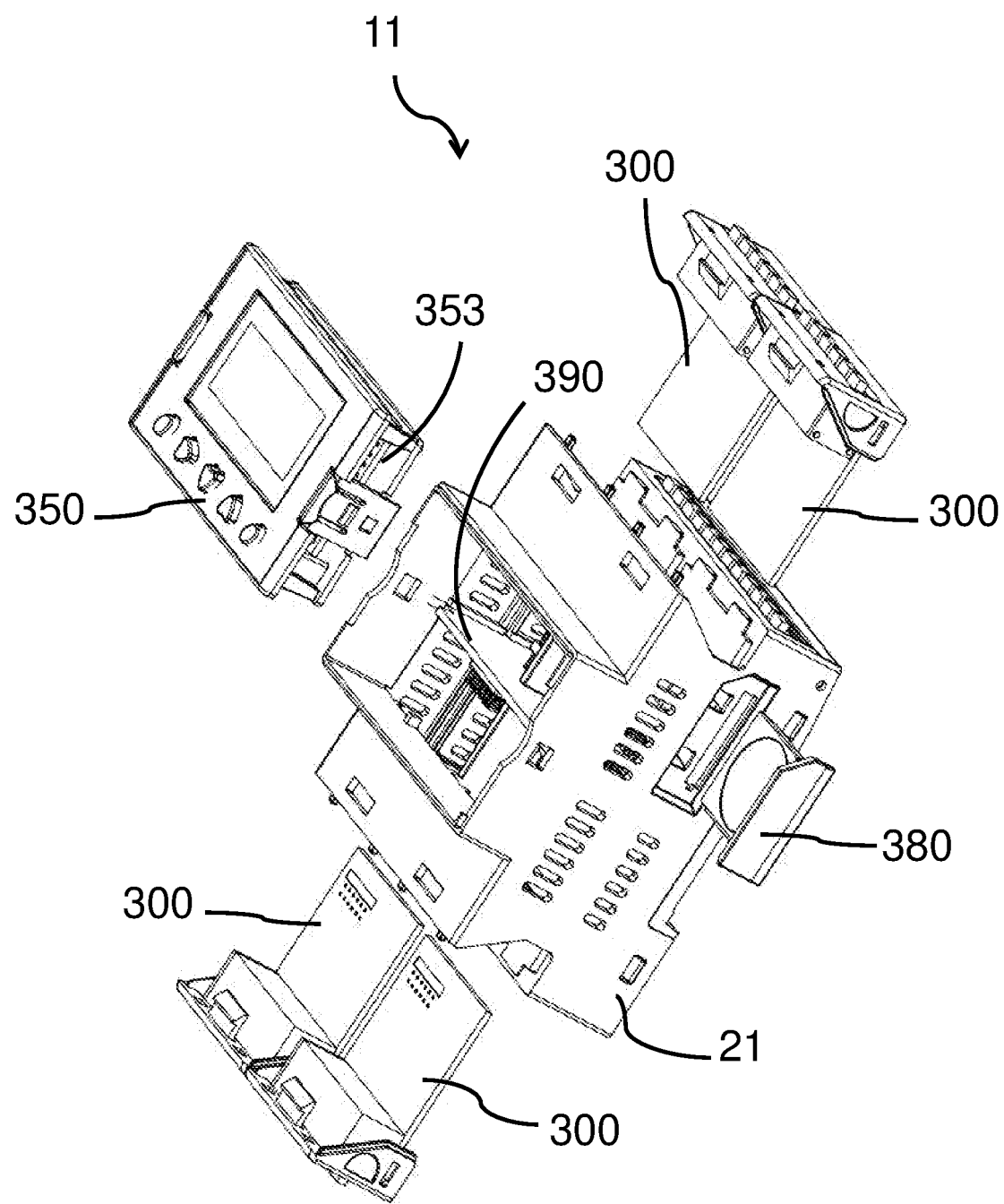
FIG. 2 is an exploded view of one of the members of a first sub-group.

FIG. 2, each member of electrical device of the first sub-group 11 comprises a base mountable enclosure unit 21, a programmable computing receptacle assembly 390 and a plurality of function modules 300. A first member of electrical device of the first sub-group 11 accommodates at least one function module 300. A second member of electrical device of the first sub-group 11 accommodates at least four function modules 300. A third member of electrical device of the first sub-group 11 accommodates at least six function modules 300, and so on.

Figure 3:
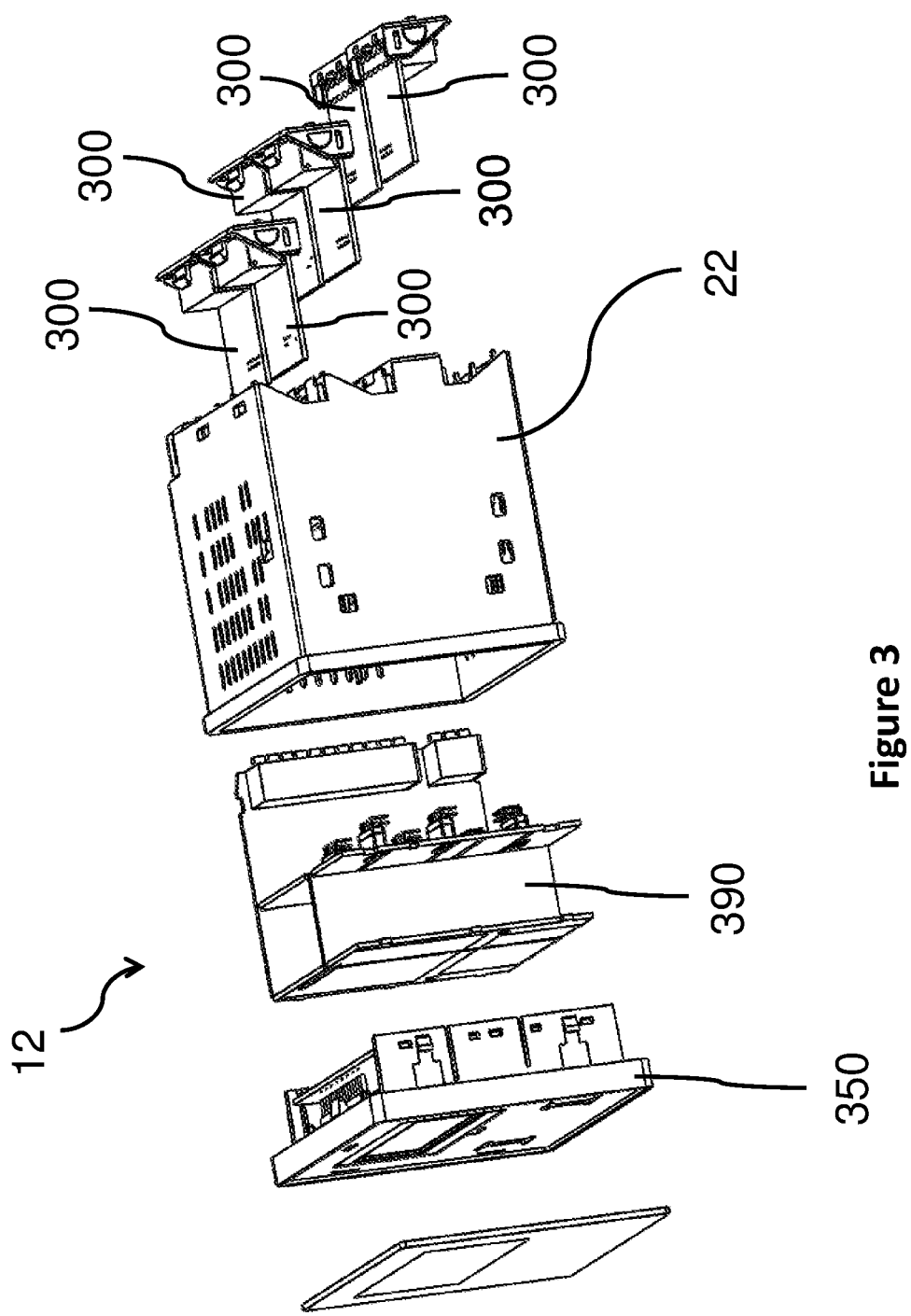
FIG. 3 is an exploded view of one of the members of a second sub-group.

FIG. 3, each member of electrical device of the second sub-group 12 comprises a neck mountable enclosure unit 22, a programmable computing receptacle assembly 390 and a plurality of function modules 300. A first member of elec- Each member of the group of electrical device 10 has a display module 350 and optionally a battery module 380. The display module 350 has a variety of sizes and kind of electrical display component, and one of the possibilities is having no display component.

Each member of electrical device of the first sub-group 11 and the second sub-group 12 is an independently configurable application specific electrical control device.

Each member of electrical device of the first sub-group 11 and the second sub-group 12 is a configurable application specific electrical control device as a slave or a master, in combination to a plurality of members of electrical device of the first sub-group 11 and the second sub-group of electrical devices 12.

Figure 4A:
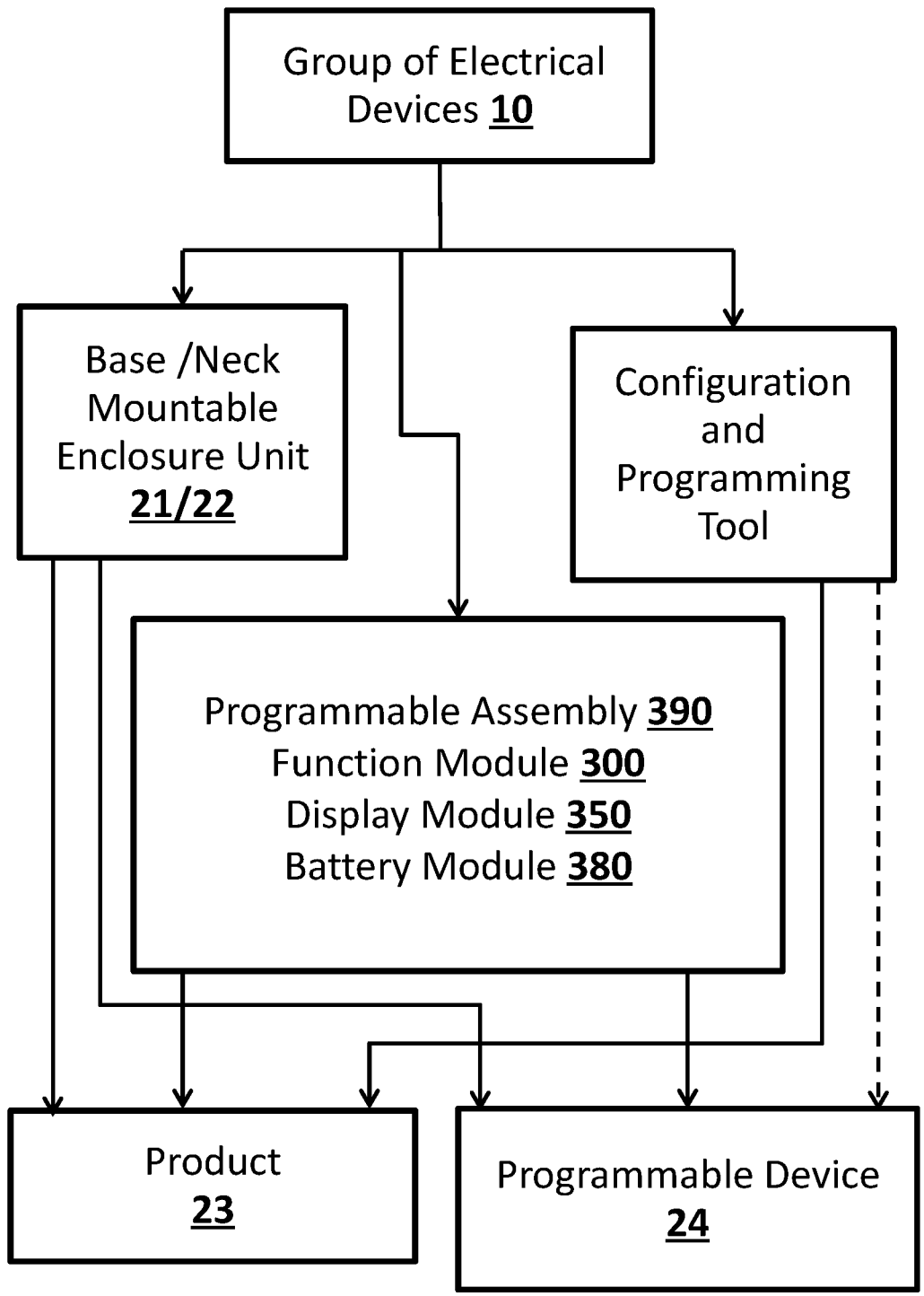
FIG. 4A as well as 4B is a block diagram giving constituents of a product verses a programmable device derivable from the group of electrical devices as per present invention.

Illustratively, an electrical function requiring an electrical control device with eight function modules 300, a display module 350 and a battery module 380 is configurable by deploying Two or more members of electrical devices of the first sub group 11, in combination; or Two or more members of electrical devices of the second sub group 12, in combination; or Two or more members of electrical devices of the first sub group 11 and the second sub-group 12, in combination; or resultantly, a most optimum equipment layout of electrical devices on a base and a panel door of any electrical cubicle is producible, as a ready-to-use product 23 or as a programmable device 24, FIG. 4.

Figure 5A:
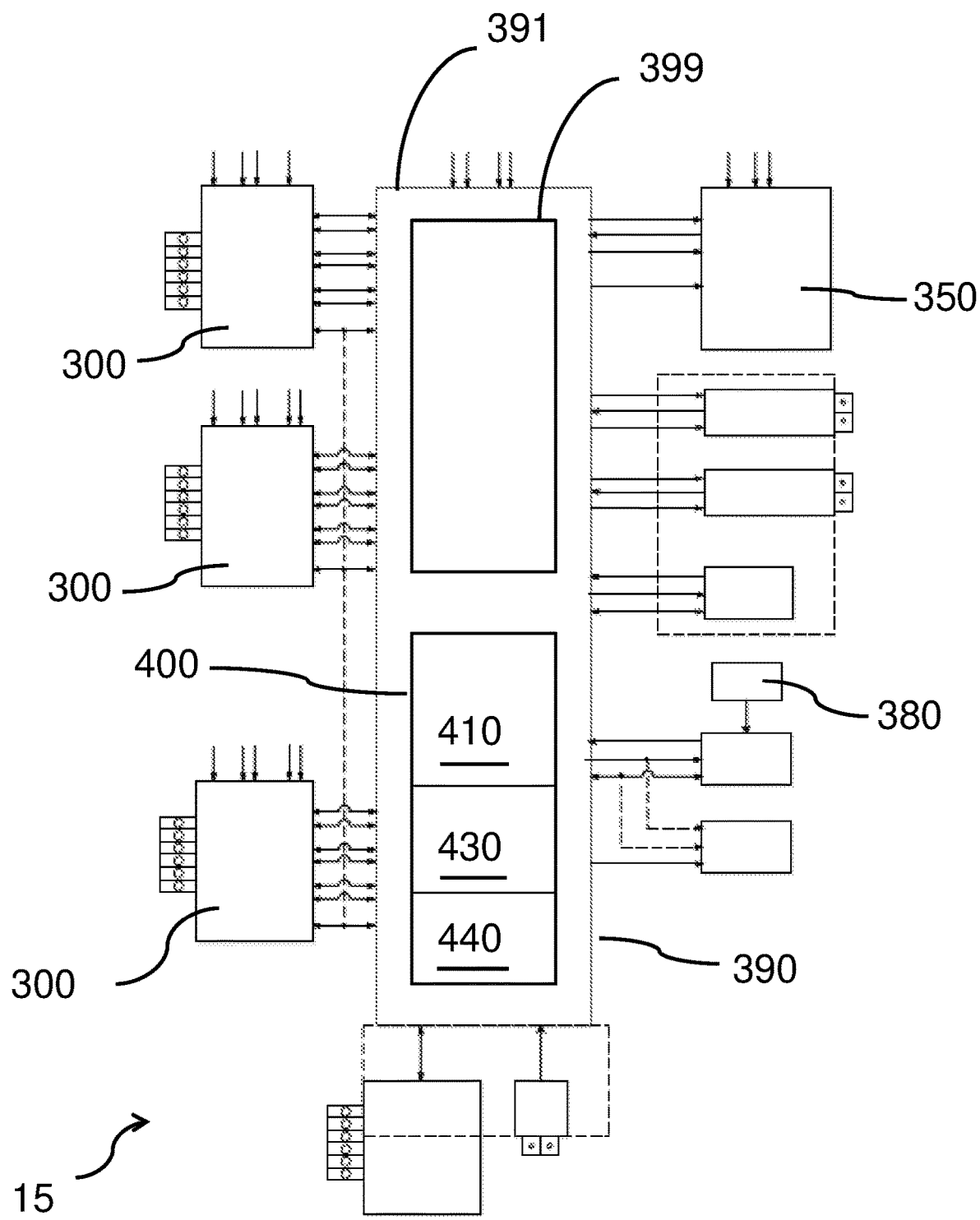
FIG. 5A, 5B as well as 5C is a block diagram of constituents of a member of the group of electrical devices.

FIG. 5, each member 15 of the group of electrical devices 10 comprises the programmable computing receptacle assembly 390, a plurality of function modules 300, a display module 350, and optionally a battery module 380. The programmable computing receptacle assembly 390 comprises a plurality of circuit boards 391 having at least a micro-controller 399 with associated electronic circuitry (not numbered), has a plurality of set of plug-in female electrical connectors 392, a set of plug-in male connectors 393, a set of wire-able connectors 394 and an optional battery cell connector 395. The micro-controller 399 is also termed as uC 399 interchangeably.

Figure 5B:
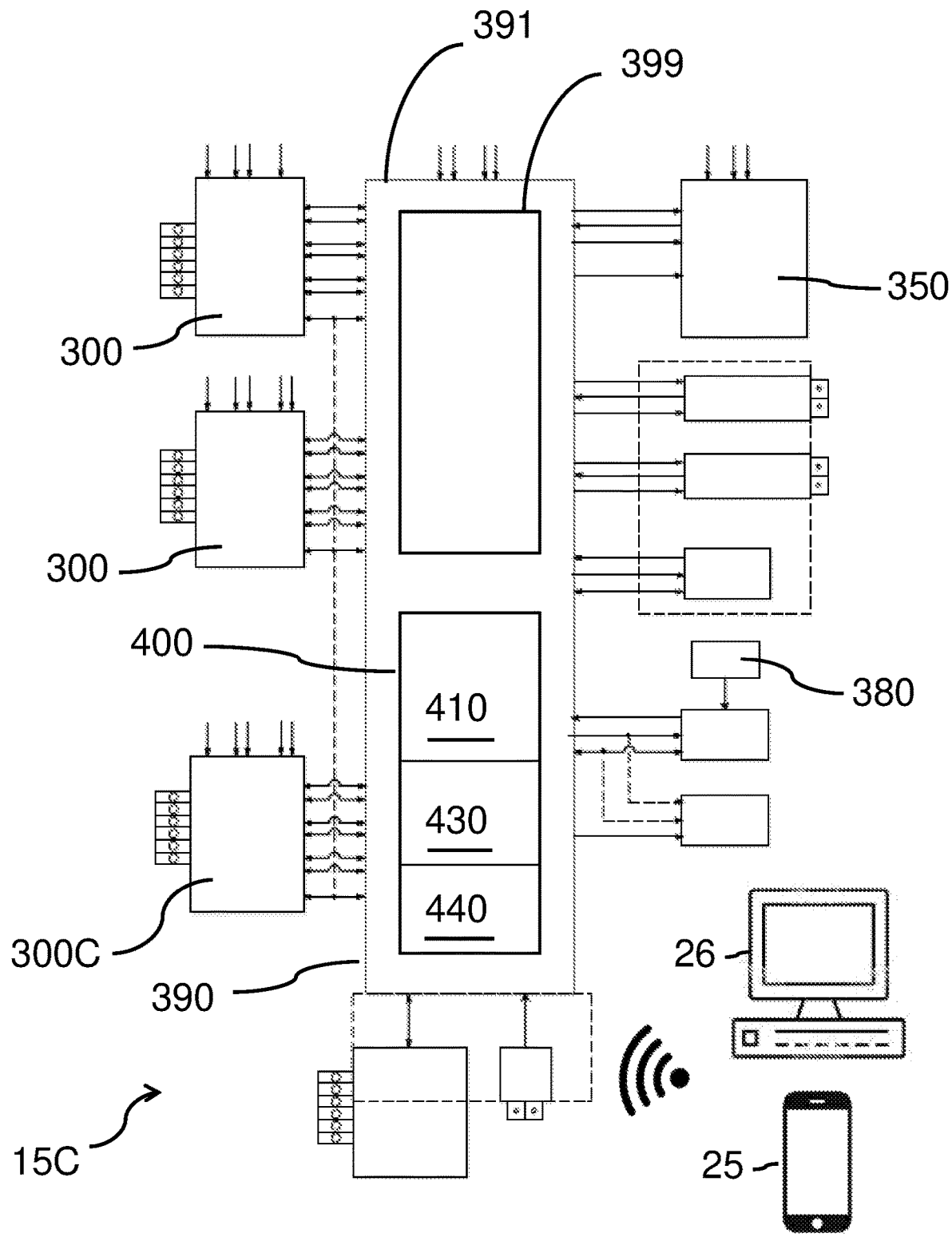
Figure 5C:
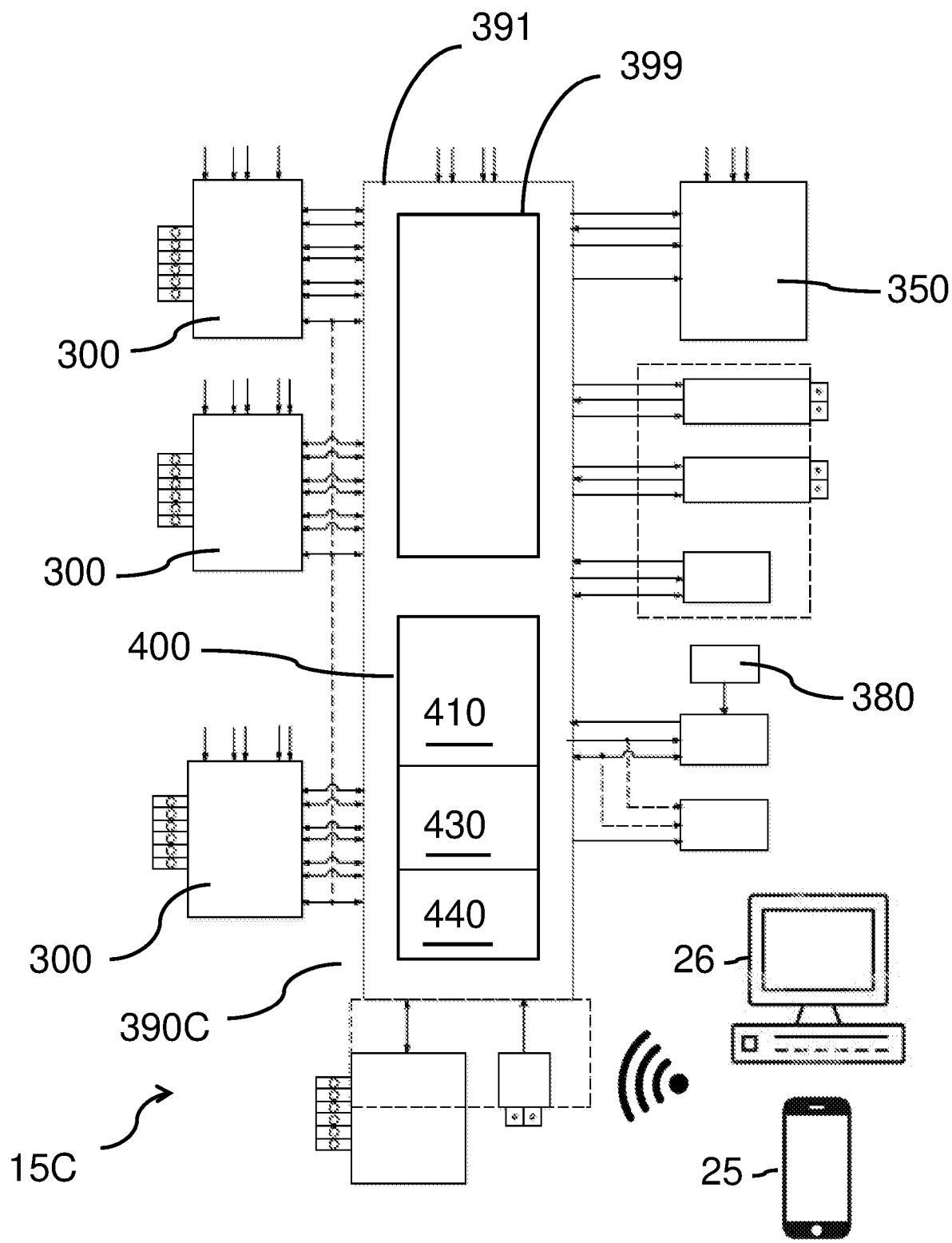
Figure 6:
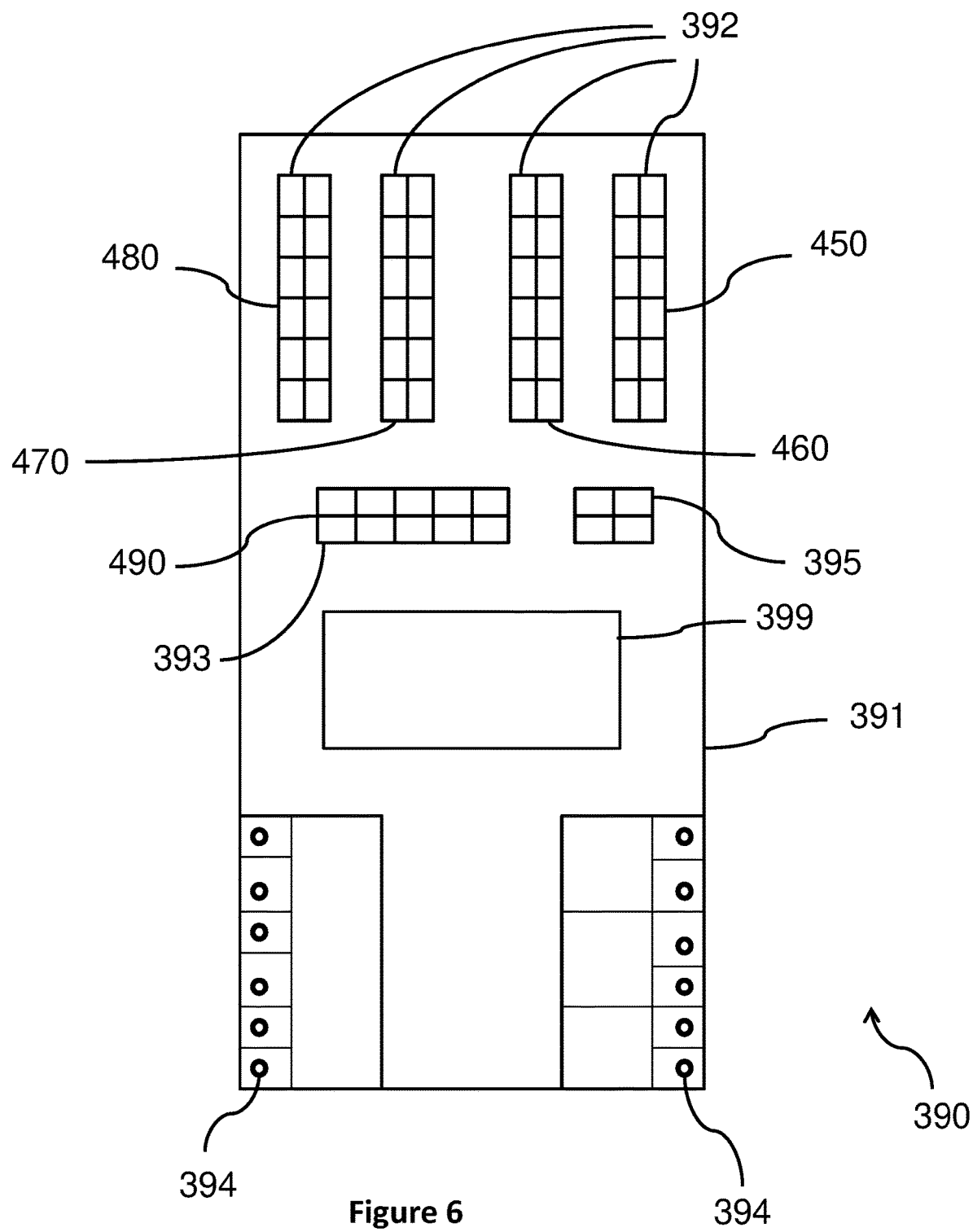
FIG. 6 is a block diagram of constituents of a programmable computing receptacle assembly.

FIGS. 5 and 6, in a preferred embodiment, the programmable computing receptacle assembly 390 comprises a circuit board assembly 391 having at least a micro controller 399 with the associated electronic circuitry (not numbered), a plurality of set of plug-in female electrical connectors 392, a set of plug-in male connectors 393, a set of wire-able connectors 394, an optional battery cell connector 395, and a set of minimal controlling means 400. The set of minimum controlling means 400 have:

(d) a plurality of input points and a plurality of output points in a prescribed combination 410, for example—
six digital inputs and three relay outputs; or
four digital inputs, two analogue inputs and three relay outputs; or
two fast digital inputs and five relay outputs; or any such combination (e) an ambience sensing point 430, and (f) a plurality of communication transceiver 440.

Note: Ambience sensing includes sensing of temperature, humidity, atmospheric pressure, atmospheric pollution, gravitational value, vibration level, jerk level.

The programmable computing receptacle assembly 390 further comprises at least one type A module receptacle 450 connecting with the function module 300 through the set of plug-in female electrical connector 392, and or at least one type B module receptacle 460 connecting with the function module 300 through the set of plug-in female electrical connector 392, a plurality of type C module receptacle 470 and or type D module receptacle 480 in the second members, the third members and so on, connecting with the function modules 300 through the respective set of plug-in female electrical connectors 392, and a display module receptacle 490 connecting through the set of plug-in male connectors 393.

Each of the type A module receptacle 450, the type B module receptacle 460, the type C module receptacle 470, and the module D module receptacle 480 has identical numbers of electrical connecting points on the set of plug-in female electrical connector 392. The current embodiment has twelve electrical connecting points as represented in FIG. 6, however the present invention is not limited thereto.

The type A module receptacle 450 is adapted to accommodate the function module 300 which has any combination of following which require a prescribed number of electrical connecting points:

Plurality of digital inputs, and or
Plurality of high-speed digital inputs, and or
Plurality of relay and/or transistor outputs, and or
Plurality of high-speed outputs
Plurality of analogue outputs, and or
Plurality of analogue inputs, and or
Plurality of load cell inputs, and or
Plurality of AC voltage or current inputs.

The type B module receptacle 460 is adapted to accommodate the function module 300 which has any combination of following which require a prescribed number of electrical connecting points:

Plurality of digital inputs, and or
Plurality of high speed digital inputs, and or
Plurality of relay and/or transistor outputs, and or
Plurality of high speed outputs
Plurality of analogue outputs, and or
Plurality of analogue inputs, and or
Plurality of load cell inputs, and or
Plurality of AC voltage or current inputs, and or
At least a data logging input.

The type C module receptacle 470 is adapted to accommodate the function module 300 which has any combination of following which require a prescribed number of electrical connecting points, subject to a capacity of the micro-controller 399 of the programmable computing receptacle assembly 390:

Plurality of digital inputs, and or
Plurality of relay and/or transistor outputs, and or
Plurality of analogue inputs, and or
Plurality of analogue outputs.

The type D module receptacle 480 is adapted to accommodate the function module 300 which has any combination of following which require a prescribed number of electrical connecting points, subject to a capacity of the micro-controller 399 of the programmable computing receptacle assembly 390:

Plurality of digital inputs, and or
Plurality of relay and/or transistor outputs, and or
Plurality of analogue inputs.
Communication port (example: WiFi/Ethernet/USB)

As a variation, the type D module receptacle 480 is adapted to accommodate the function module 300 which has an extended number of electrical connecting points, so as to accommodate special functionality extension like Ethernet card (will need 24 pin connector). Such type D module receptacle accommodates the function module 300 having 12 connecting points as well as 24 connection points.

The product 23 or the programmable device 24 having the set of minimum controlling means 400, the type A, the type B, the type C and the type D module receptacle is arrived at differently for different members 15 of the group of electric device 10, based on understanding of industry requirement of application specific control products, and a balance between a physical packaging, the capacity of the micro controller of the programmable computing receptacle assembly 390, and cost.

Person skilled in the art well appreciate that since each receptacle 450, 460, 470 and 480 corresponds to a different electrical schematic, these receptacles are mechanically identical but electrically different. In order to meet the objective of being able to plug in different kinds of function modules 300, present invention ensures a harmonization between different receptacles such that the function module 300 suited to functions of the type D module receptacle 480 can also be disposed in the type C module receptacle 470, also in the type B module receptacle 460 and also in the type A module receptacle 450.

the function module 300 suited to functions of the type C module receptacle 470 can also be disposed in the type B module receptacle 460, also in the type A module receptacle 450.

Persons skilled in the art know that process parameters are large in number and dictate cost of the programmable device 24 or product 23. It is also known that process parameters vary at relatively different real time and different rate. While few process parameters need to be communicated and processed, in other words responded to, at the rate of 1 to 20 kHz. or more, a large number are optimally managed at a relatively lesser response time. Still fewer require faster frequency of response too. Number of ports on any micro-controller 399 are limited primarily due to a physical constraint.

Figure 7A:
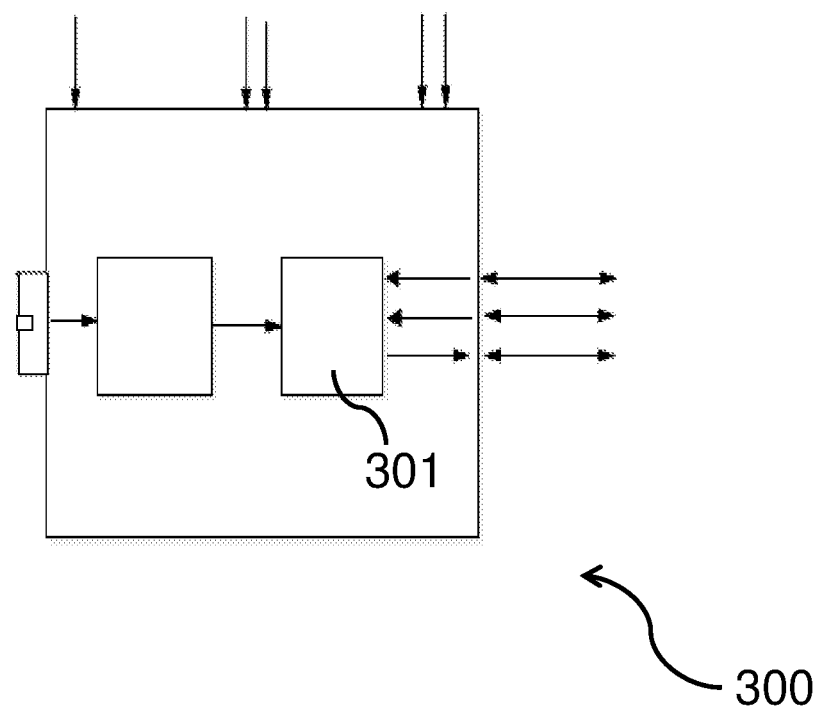
FIG. 7A, 7B is a partial block diagram of a function module having a barrel shifter.
Figure 7B:
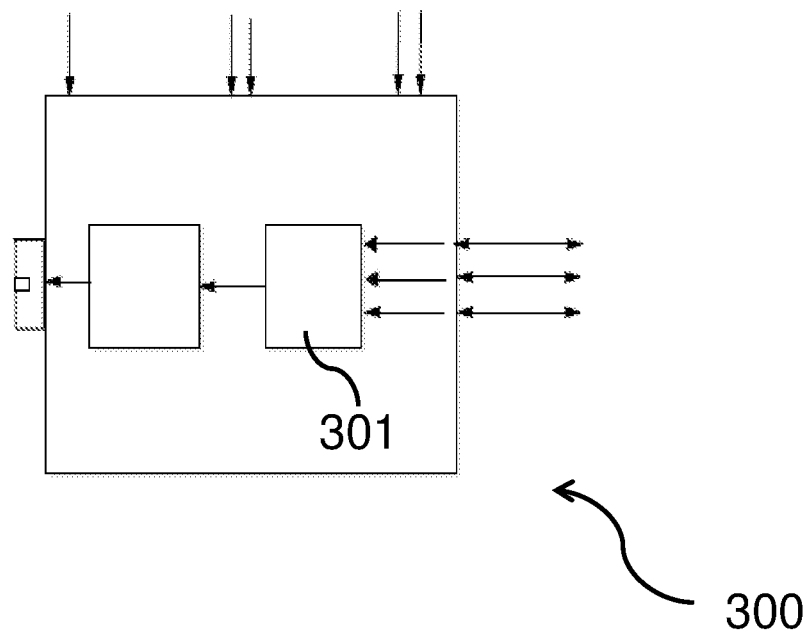
Figure 7C:
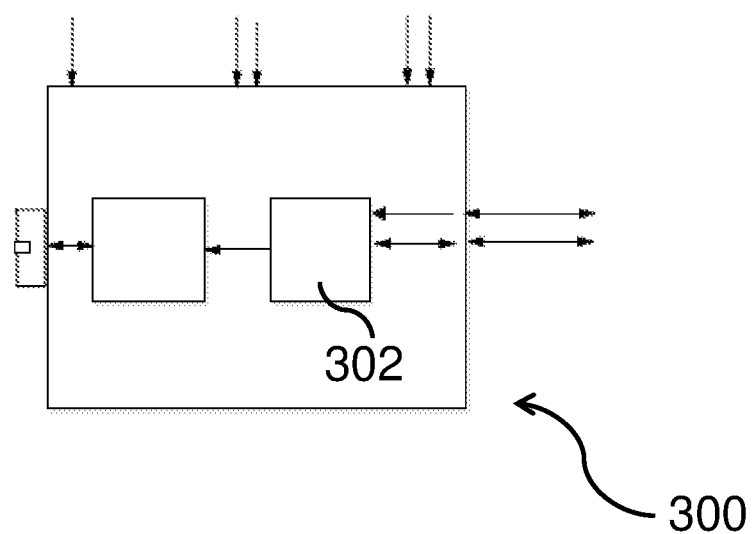
FIG. 7C is a partial block diagram of a function module having a slave intelligence.
Figure 7D:
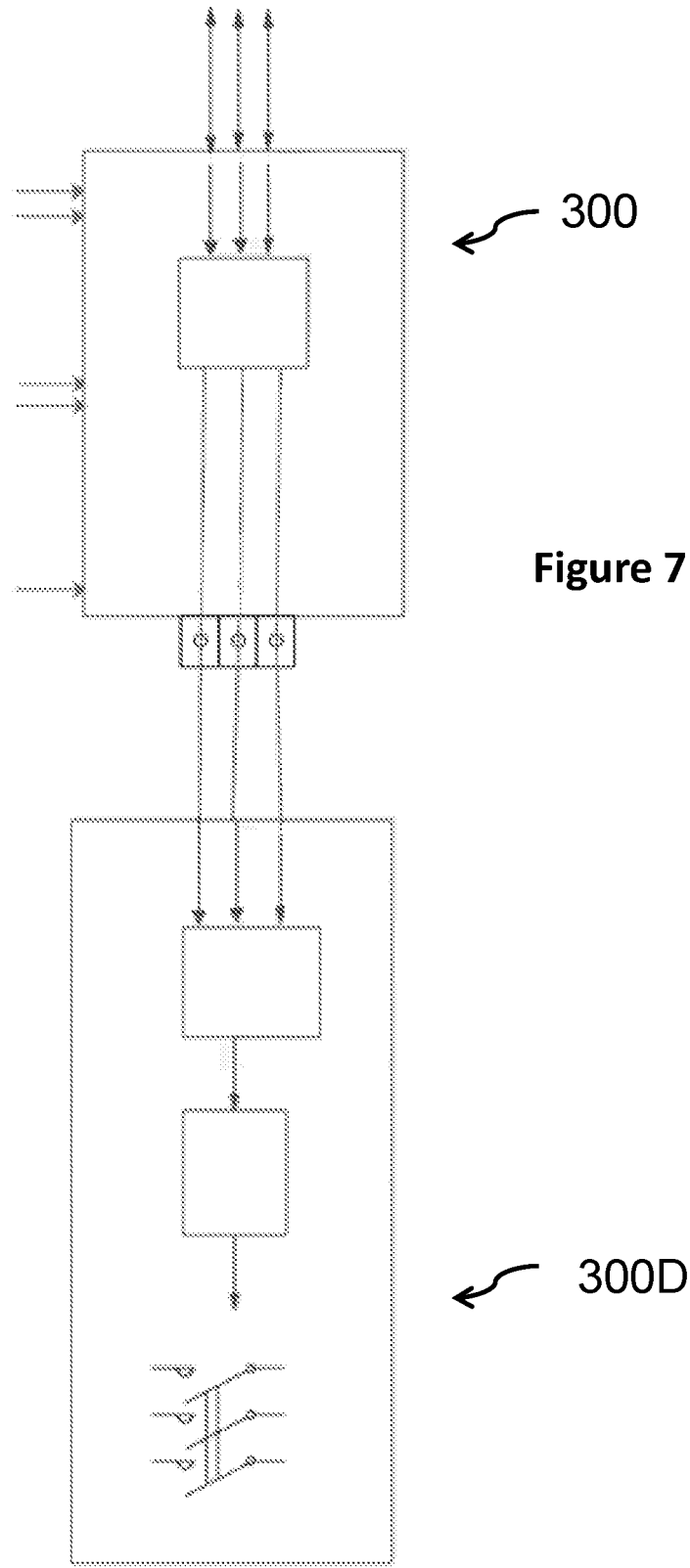
FIG. 7D is a partial block diagram of a driving module 300D outside (external to) the function module.

In the present invention, an effective number of ports of the micro-controller 399 are expandable by providing on the function module 300 on the function module 300, a barrel shifter 301 communicating with two ports of the micro-controller 399. FIG. 7A/FIG. 7B; and extendible up to 16 digital inputs/16 transistor outputs by cascading the barrel shifter 301;

on the function module, a slave intelligence 302 (a slave micro-controller) communicating with two ports of the micro-controller by a serial interface interfacing. FIG. 7C;

outside (external to) the function module 300, a driving module 300D, comprising a receiver with a driver to drive a final element, like a contactor or a relay, FIG. 7D. The driving module 300D is independently disposable in an enclosure.

Such software aided ports have optimal response time and are a cost effective solution.

In the preferred embodiment of the present invention, the function module 300 has six allotted ports of the uC 399, configured in following alternatives:

---

Direct I/O drive (DI/RO/TO/FI/FO/AT/AO) from Main uC to IO Card
I2C bus for eeprom OR communicating to separate intelligence on IO Card (through software bit banging mechanism)
SPI bus for communicating to separate intelligence on IO Card OR drive an Analog/Digital/Memory device residing in IO card
Serial UART bus for communicating to separate intelligence on IO Card
Parallel 4 bit bus for communicating to separate intelligence on IO Card (using any software protocol)
Barrel logic - to cater to high I/O count requirement

---

The invention is not limited by above alternatives, nor number of ports.

Figure 8:
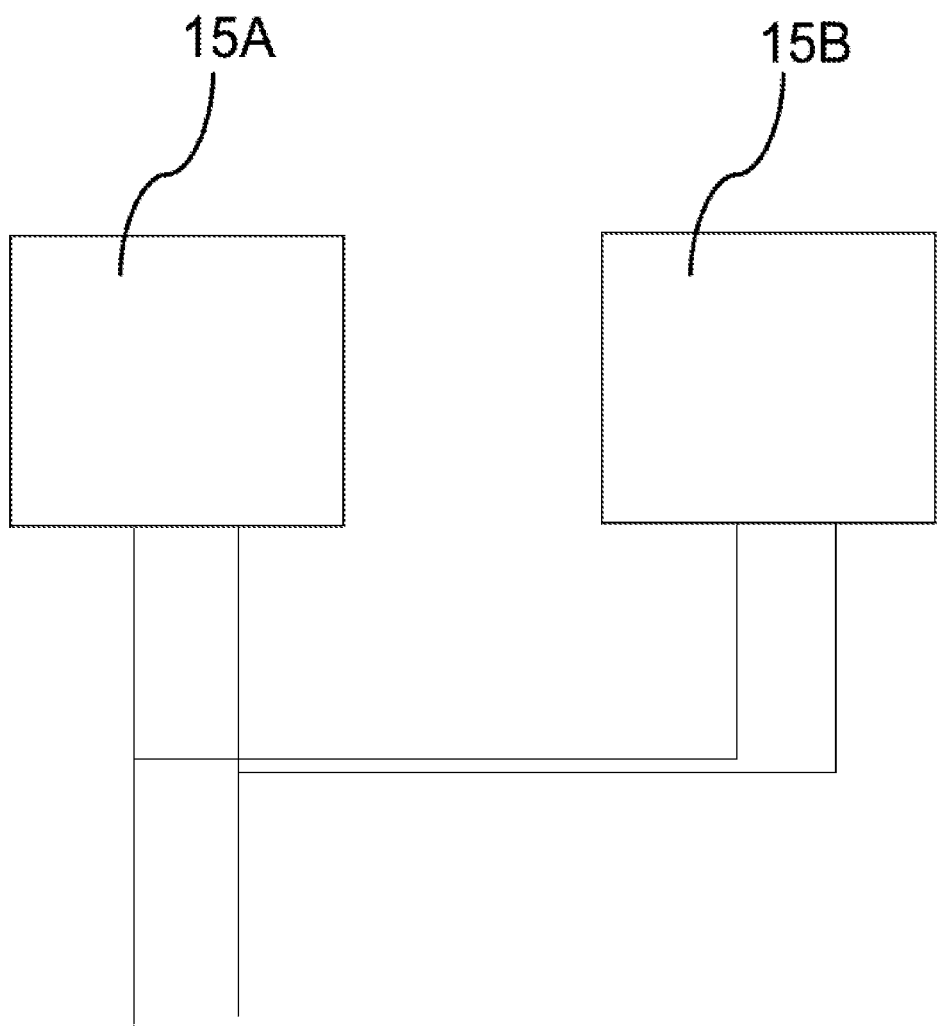
FIG. 8 is a partial schematic diagram of electrical connection between RS 485 ports of a master member and a slave member.

Need based, a user selects, from the group of electrical devices 10, one or more member(s) of electrical device of either of the first sub-group 11 or the sub-group 12, and if needed, one or more member(s) of either of the subgroup 11 or the second sub-group 12, and one or more function modules 300, and a display module 350 and optionally a battery module 380. In applications needing two members of electrical devices in combination as a master member 15A and a slave member 15B, then an RS485 port of the master member 15A and an RS485 port of the slave member 15B are connected as shown in FIG. 8.

The present invention of group of electrical devices 10 facilitates virtually unlimited permutations and combinations in mechanical form factor without compromising reliability and functional efficiency of each member 15 which is same as or higher than an industrially produced application specific product, also known as a standard product or a factory-built product.

Figure 9:
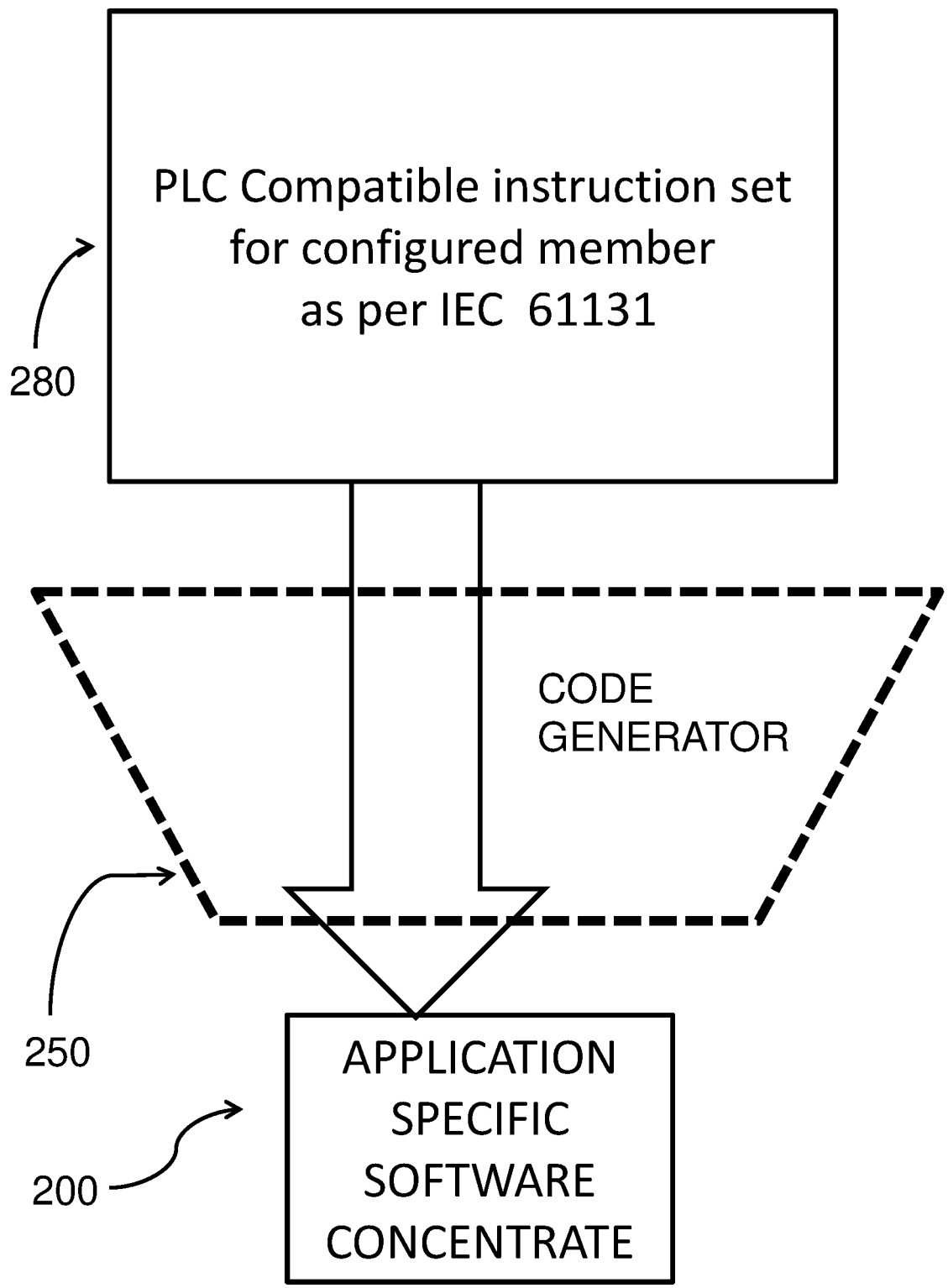
FIG. 9 is a logic flow diagram to arrive at an application specific software concentrate, as derived from a code generator.

FIG. 9, an application specific software concentrate 200, which is essentially an application specific firmware, is producible as per present invention by which an applicable configured product executes a set of desired functions. The application specific software concentrate 200 is derived from a code generator 250 which converts a PLC compatible programming language 280 into the application specific software concentrate 200. Term "programming language" includes Ladder diagram (LD), Function Block Diagram (FBD), Sequential Function Chart (SFC), Structured Text (ST), custom-built Instruction set or Instruction List (IL).

The application specific software concentrate 200 is an abridged firmware which is converted to a direct executable instruction set for the product microcontroller, & hence the program runs with optimum speed for any functionality; wherein functionalities unwanted in the applicable configured product are suppressed while a prioritized functionalities are configured to run with an interrupt service routine code (ISR). Consequently, an execution time typical of the PLC compatible programming language 280 gets cut significantly and becomes of the order of a tailor-made product, also known as a factory-built product or a standard product. Note that here, primarily the speed is achieved due to direct uC instruction set; additionally & alternatively, certain functions can be configured to run in an ISR which is optional.

For an illustration an electronic pulse counter device is considered here, such a counter has following functional specification for issuing a switching off instruction to a motor within a resolution of 0.5 mS:

One fast input suitable for receiving electrical pulses of up to 20 kHz.

Two relay outputs, having settings at a count of 90 electrical pulses and 100 electrical pulses respectively, the motor to be slowed down at 90 electrical pulses and stopped at 100 electrical pulses.

In the following paragraphs, three alternative controlling devices are relatively compared for response time of execution:

1. A prior art counter as a factory-built product.
2. A prior art plc device
3. A member of the group of electrical devices 10 as per present invention The factory-built product is built around a 32-bit, 20 MHz controller having input hardware with suitable filter that can allow such high frequency electrical pulses. A driving software generally includes an interrupt service routine code (ISR) so that a relay action can be executed in the ISR itself, implying that a corresponding relay1 and relay 2 switching takes place in the ISR when 90 pulses and 100 pulses are counted respectively.

Even without including the ISR, an execution time less than 1 mS for such "while loop" execution is possible and would meet the requirement. Such software are written in C or C++ or equivalent contemporary and efficient software languages, and then for creating an output executable file that runs as per direct uC instruction set.

The prior art plc device deployed for such functionality would need to be around a 100 MHz controller wherein typical execution time of corresponding "while loop" execution is between 2 mS to 20 mS, particularly since a PLC compatible output executable file is NOT same as uC instruction set. Example, to run a MOV instruction in the PLC compatible output executable file, the product firmware will have an interpreter inside it's firmware code—that will convert this MOV instruction to uC MOV instruction in say 5 to 10 uC instructions and may even take up to 50 uC instructions to convert a specific instruction (say MUL).

The member of the group of electrical devices 10 as per present invention is executed by the application specific software concentrate 200 which derived from the code generator 250 wherein the PLC compatible programming language 280 gets abridged which is converted to a direct executable instruction set for the product microcontroller, & hence the program runs with optimum speed for any functionality; wherein functionalities unwanted in the applicable configured product are suppressed while a prioritized functionalities are configured to run with an interrupt service routine code (ISR). Consequently, an execution time typical of the PLC compatible programming language 280 gets cut significantly and an execution time of the application specific software concentrate 200 becomes of the order of the prior art counter.

The code generator 250 is a proprietary software of "SELEC Controls Private Limited, India", which is capable of creating a executable file in C or C++ or contemporary computer language and comprises software elements including:
1) uC Drivers/Peripheral drivers
2) IO Card configuration functions, as if they are attached to a controller directly
3) Application specific ISR functions
4) User Application ladder logic
5) HMI Pages for user configuration encompassing an entire user interface The output of the code generator 250 is an equivalent code of a target Standard Product. The code generator 250 is architectured such that it derives the desired code as per Input/Output (I/O) card selected & creates a function (say SetPortFunctions( ),) which directly sets the port functions as per desired functionality at power up. It also adds/creates respective Peripheral & ISR files that will be needed for application functionality (like Capture ISR). The code generator 250 updates & reads the IO card status at it's direct port as if it is fixed IO configuration up to a single I/O as a smallest possible configuration.

Figure 10A:
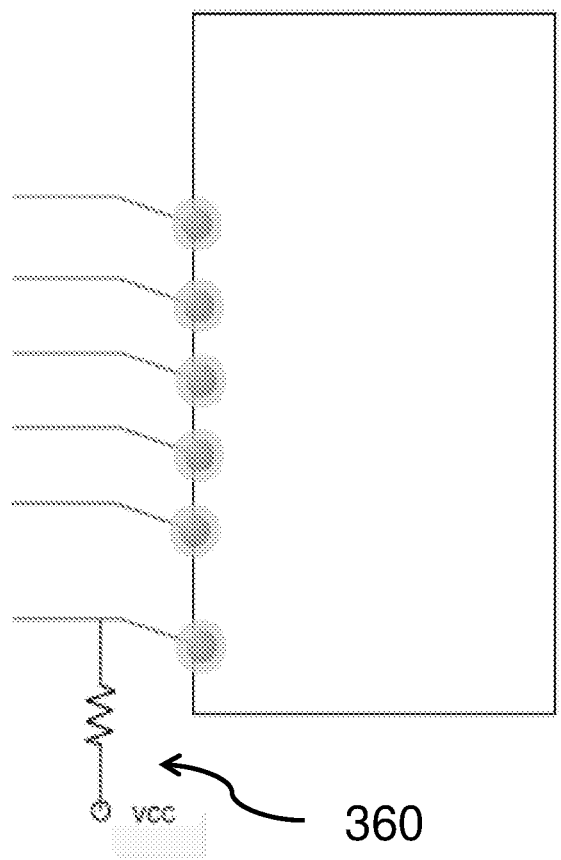
FIG. 10A, 10B, 10C are partial schematic diagrams related to safe configuration of the uC ports.
Figure 10B:
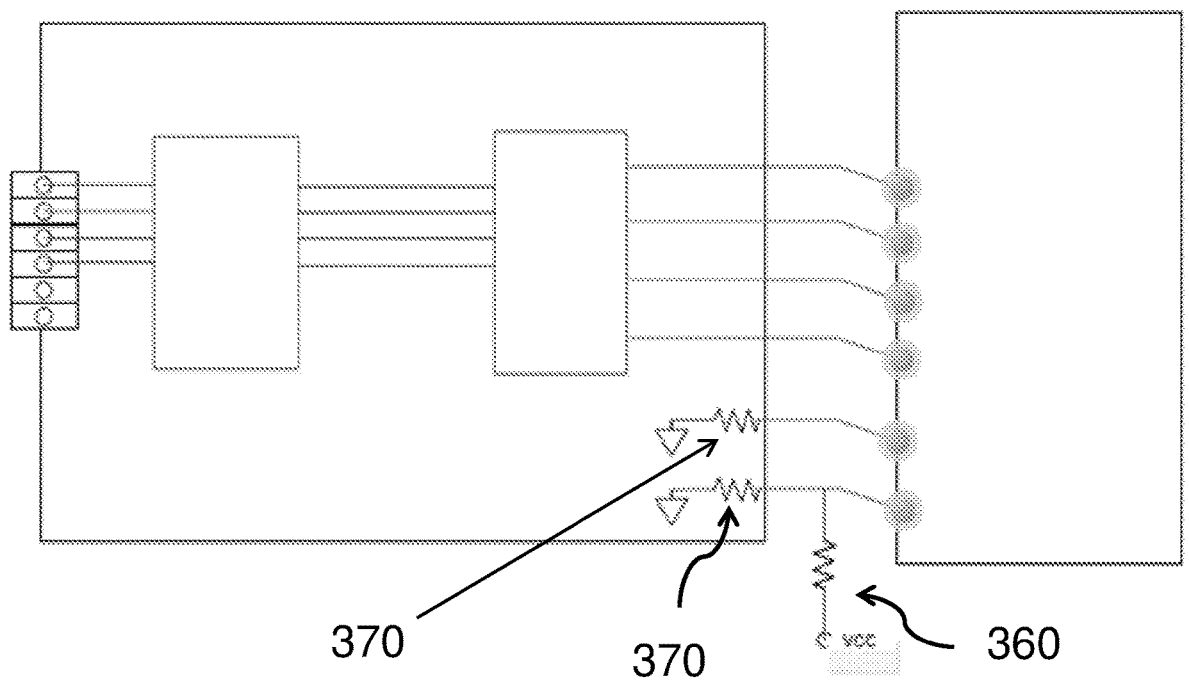
Figure 10C:
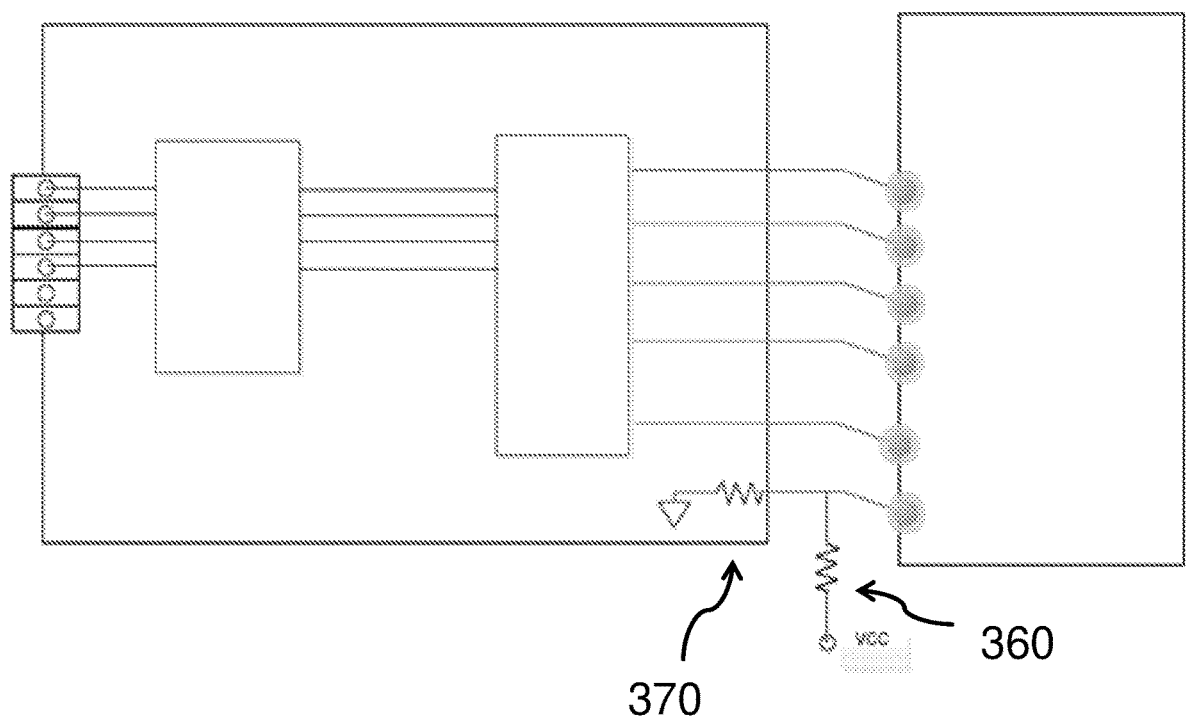

Since each member of electrical device of the first sub-group 11 as well as the second sub-group 12 is essentially producible by picking and assembling from a large variety of function modules 300, it is important to ensure that mechanical and electrical modularity are interdependently robustized. The present invention addresses this aspect as explained now. FIG. 10A 10B, 10C, there are likely situations where a user has configured a slot of the member of the group of electrical device 10 which is to be configured for 5 digital inputs but has not inserted a corresponding function module 300. Also, there are likely situations where a user has configured the slot for the member under configuration for 5 digital inputs but has actually connected less than 5 digital inputs for the time being. Persons skilled in the art are well aware that any open port of any controller generally leads to nuisance operation or product malfunction consequent to instability of such connected controller—for, the controller gets into an undeterministic state, either hangs or resets. In a standard product or factory-built product, such unused uC ports are protected against nuisance operation by way of a hardware solution through a pull-up or pull-down resistor 370 which permanently pulls up or pulls down an unused port, FIG. 10B. The members of the group of electrical devices 10 as per present invention have a card detect circuitry 360 disposed at a pre-designated port of the micro-controller 399 for each slot. In the event that the input module is not inserted, the card detect circuitry 360 maintains a high input at the micro-controller port. Consequently, the micro-controller gets an instruction to force and set all its unused ports to OUTPUT mode periodically in a loop time less than one millisecond. This inventive solution retains the possibility of using any unused input port at a later date. FIG. 10C, each function module 300 has a pull down resistor 370 at a pin corresponding to the pre-designated port of the micro-controller, so that when the function module 300 is detected the micro-controller 399 does NOT intervene.

It is to be noted that setting an unused port to OUTPUT mode once or at intervals longer than 2 millisecond does NOT adequately address the issue of nuisance operation a this method of periodic setting is an integral part of the present invention.

Each member of electrical device of the first sub-group 11 as well as the second sub-group 12 auto detects a presence of the display module 350, auto detects the display module 350 physically connected, and verifies a hardware of the display module 350 with a display module configuration entered. In situations where the display module 350 connected is different than the display module 350 configured then an error message is generated, displayed on the connected display module 350 and or communicated via a communication port, which is generally a serial communication port like UART port.

For the functional module 300 having an analog input and or an analog output, there is provided an amplification circuitry wherefor an offset calibration parameter and a gain calibration parameter resides in a local eeprom present on the function module 300. In the preferred embodiment, there are 6 allotted ports of the uC 399 on the function module 300, 3 of which are engaged for an $i^2c$ communication between Main microcontroller & the local eeprom. The application specific software concentrate 200 auto-configures the ports & the function module 300 functions accordingly. The $i^2c$ communication uses a known bit-banging method and consequently microcontroller's $i^2c$ peripheral requirement is eliminated. At power ON, after detecting a presence of the function module 300 with the analog input and or the analog output, the micro-controller 399 reads the offset calibration parameter and the gain calibration parameter residing in the local eeprom & saves in it's random access memory. The application specific software concentrate 200 applies a calibration check that the offset calibration parameter and the gain calibration parameter are within a prescribed range. In the event that the calibration check fails, which could be due to an eeprom failure/corruption or inappropriate calibration data or no calibration data present or any other reason, then a pre-decided calibration values are considered and a calibration fault flag is generated on the display module 350 and/or read via a data communication.

Since the members of the electrical device 10 are configurable and deployed in wide applications, it is imperative that errors or defects creep in field conditions and the present invention addresses at least following eventualities:

| Failure Possibility | Addressed By |
|---|---|
| Inappropriate functioning due to open or unused ports of the micro controller 399 | Periodic dummy setting of unused/ports as an OUTPUT port, when card is not inserted OR by port pull-down at IO card, while wrong card is inserted |
| Inappropriate functioning of the member due to noise, fluctuations and harmonics in electric supply | Software watchdog; Low voltage differential signaling (Low Voltage Directive, European directive 2006/95/EC) for system recovery and testing |
| Electricity switch off/failure during application downloading | System remains in Boot loader mode until completed download and repeated application download retry till completed download |
| Attempt to download inappropriate ladder bin file (Trying to load in different hardware) | Prevention by Product ID and password during handshake |
| Communication failure | Diagnostic error codes |
| Wrong Display card insertion | Error message on display or @ comm port |

Figure 11A:
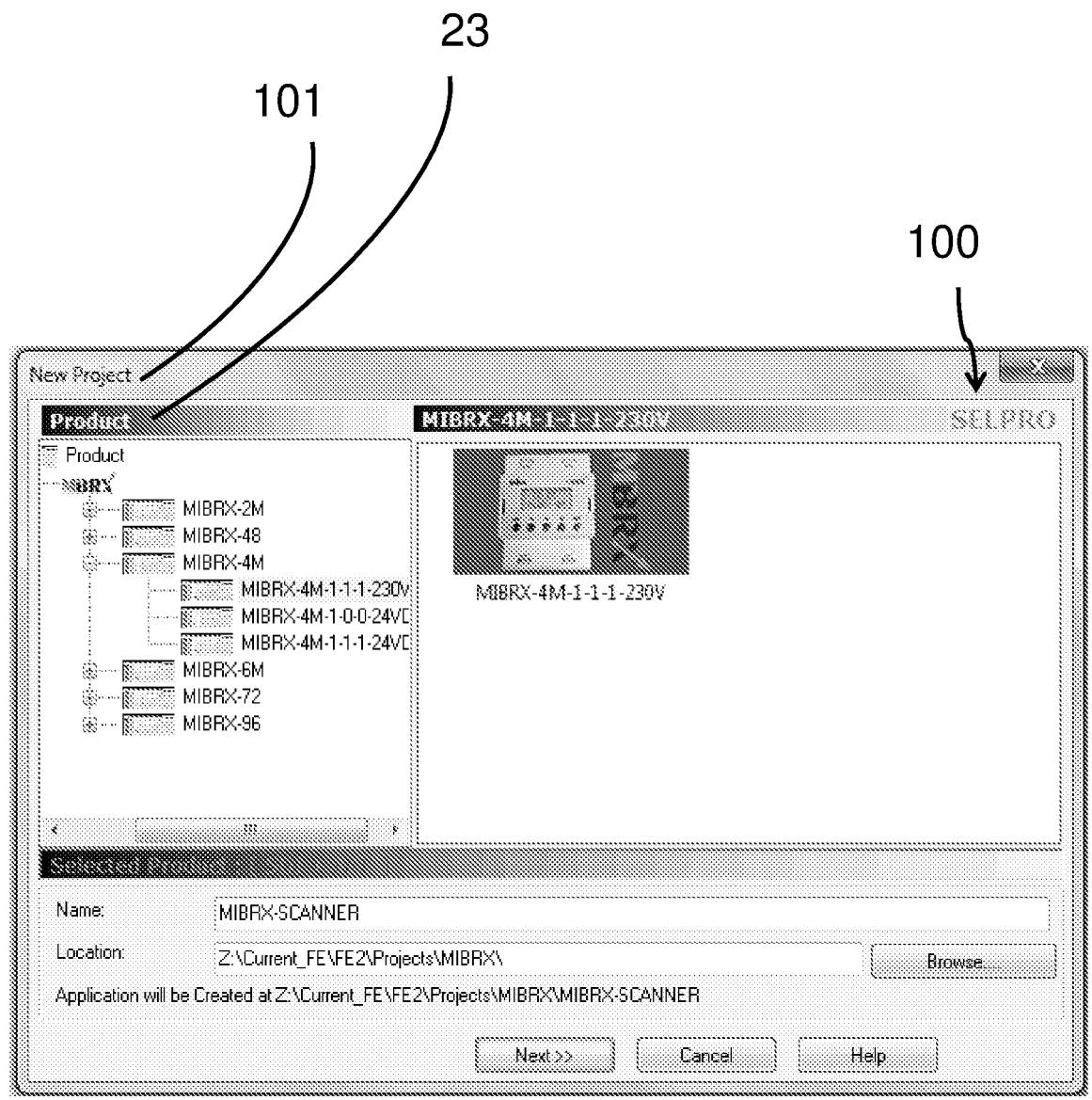
Figure 11B:
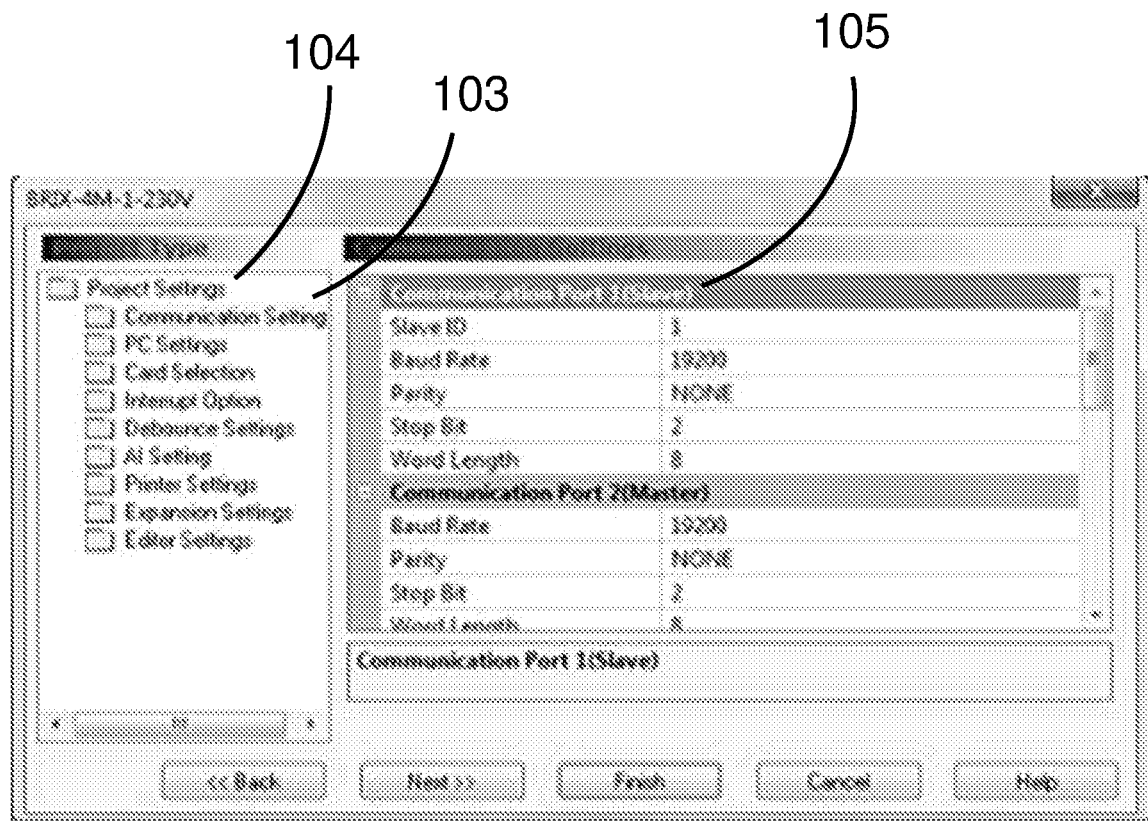
Figure 11D:
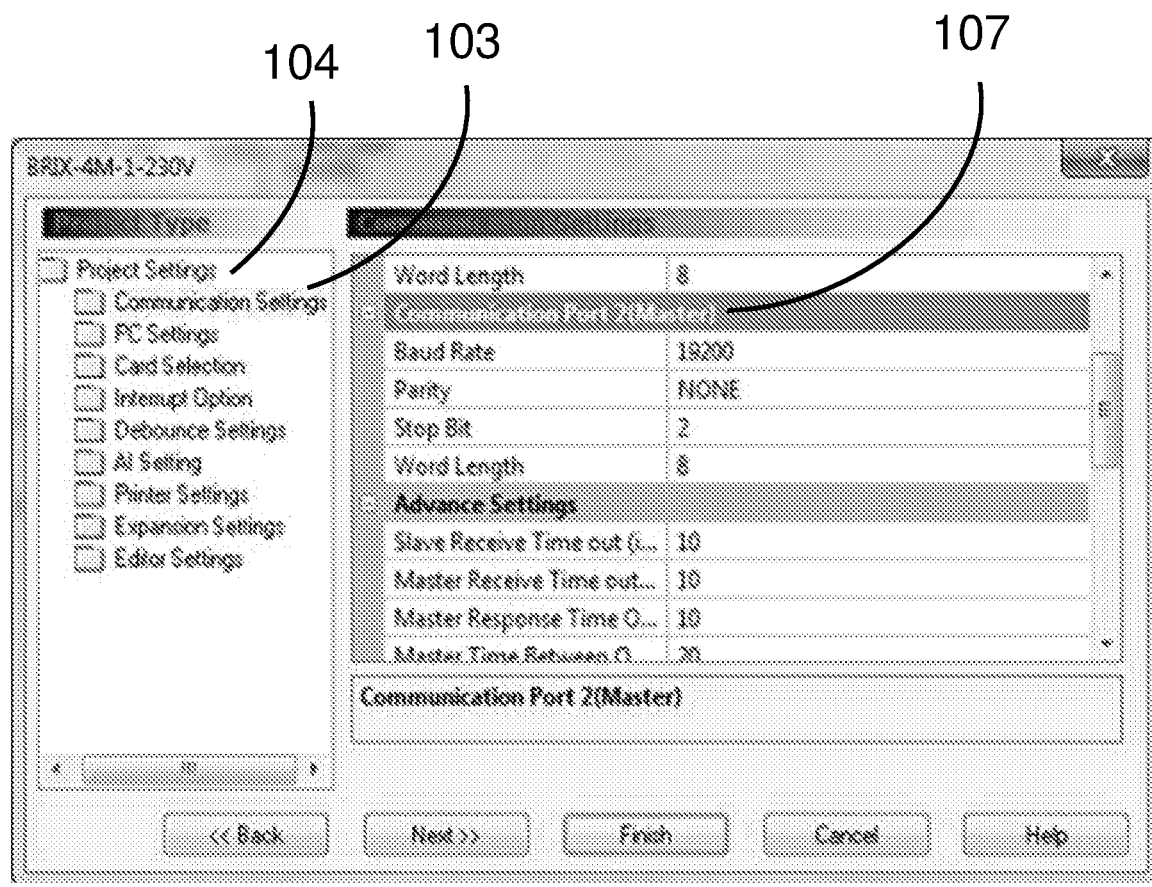
Figure 11E:
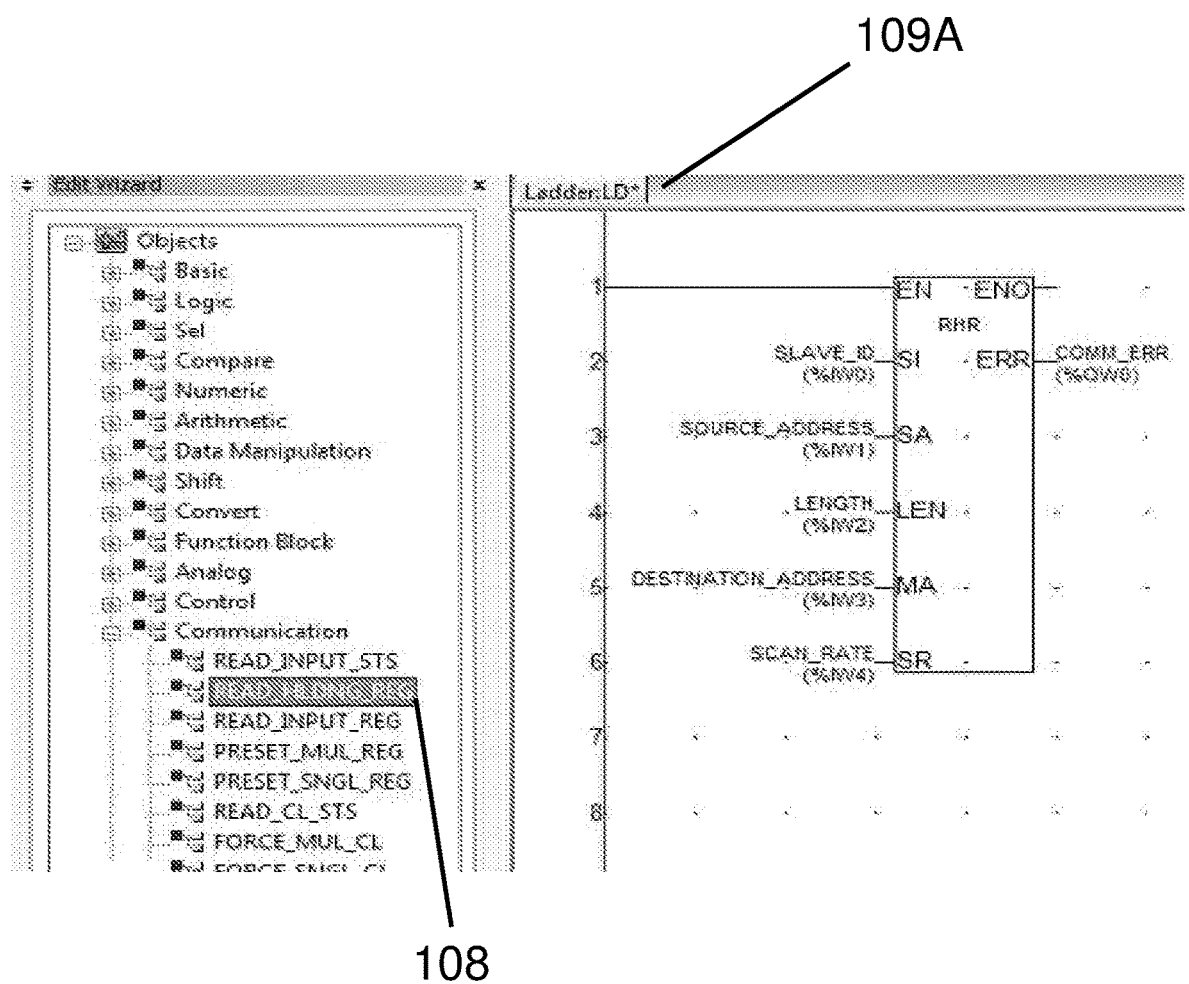
Figure 11G:
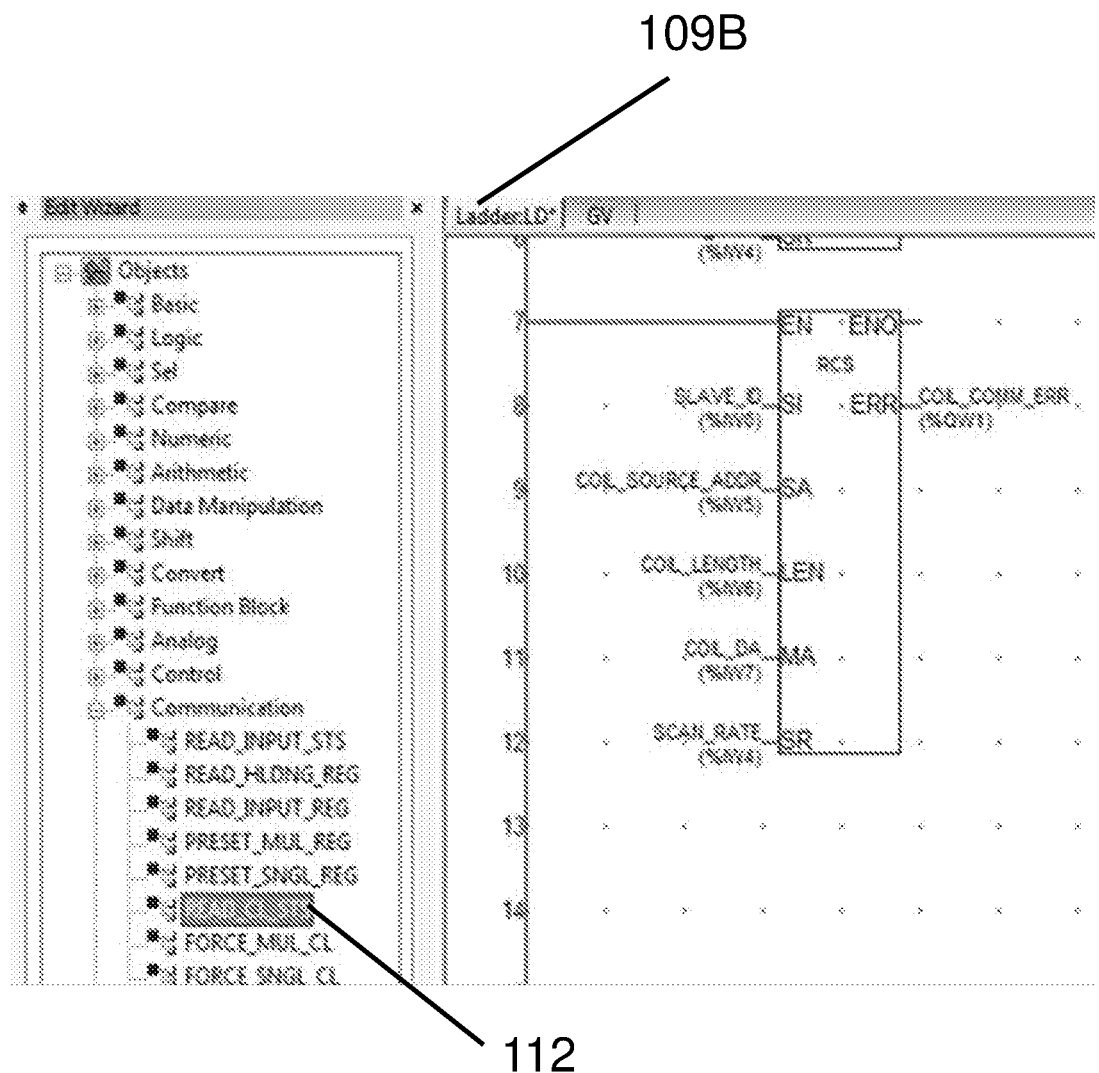
Figure 12:
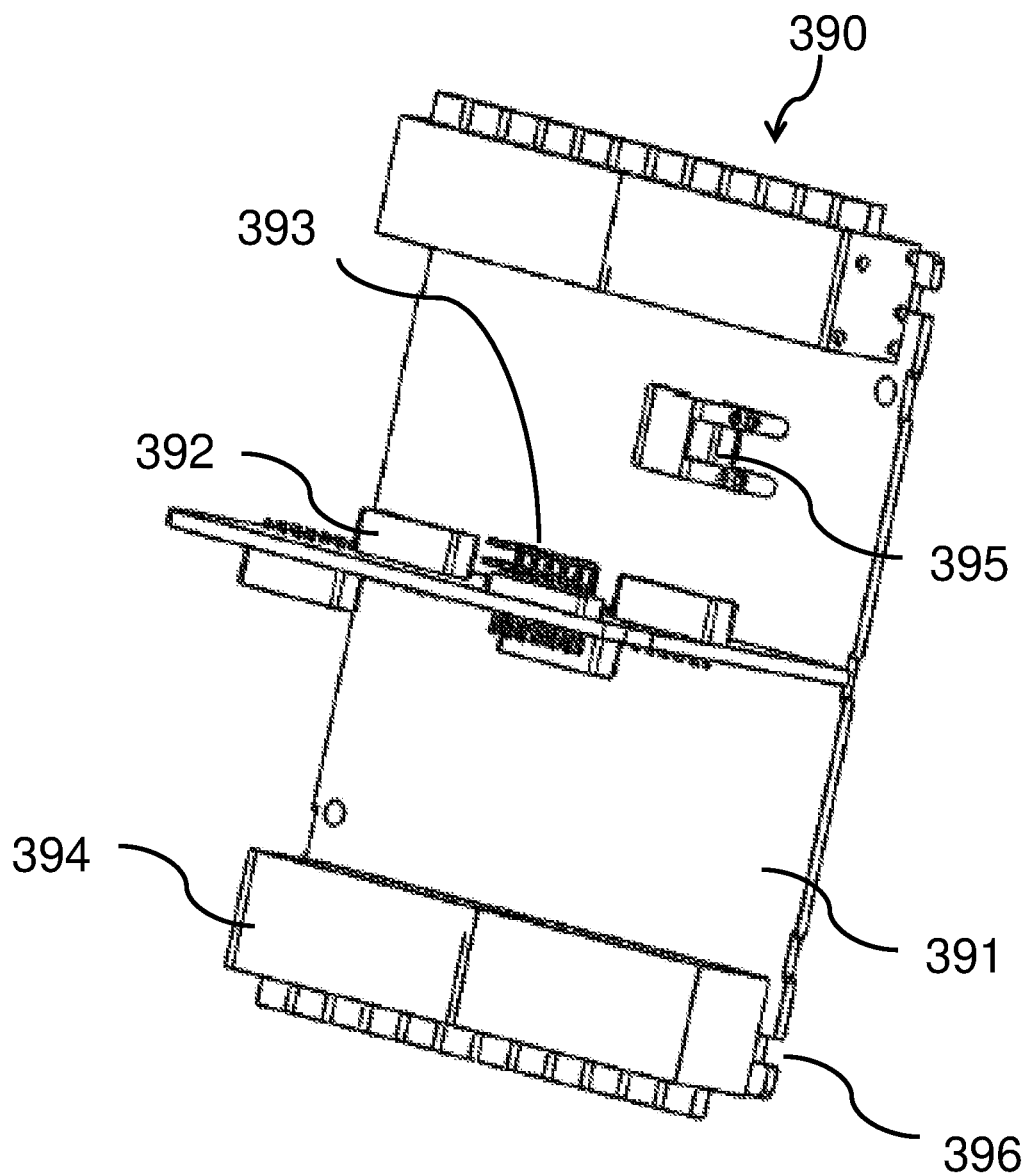
FIG. 12 is a perspective view of the programmable computing receptacle assembly.

FIG. 11A, a programming and configuration tool 100 in the form of a computer program, named "SELPRO" is deployed to program and configure the programmable computing receptacle assembly 390. The programming and configuration comprises the gross steps of:
  Selecting a product 23 from a drop down menu "New Project" 101
  Selecting function modules 300
  Creating a ladder diagram for a control logic of respective function modules 300
  Simulating an execution of the ladder diagram
  Customizing a user interface from a generic interface
The master member 15A and the slave member 15B of electrical devices are configured and programmed in following steps:
  Selecting a "Communication Settings" 103 in Project Settings 104 of the programming and configuration tool 100, FIG. 11B.
  Configuring the slave member 15B of electrical devices of the sub-group 11 by adding a values of a baud rate, a parity, a stop bit, a word length, a response time values on a Communication Port 1 105 assigned for slave configuration.
  Defining in a GV table 106A (Global Variable table) a 4 integer variables and a 2 coils as, FIG. 11C.
  Configuring the master member 15A of electrical devices of the sub-group 11 by adding the identical values of the baud rate, the parity, the stop bit, the word length, the response time values time on a Communication Port 2 107 assigned for master configuration, FIG. 11D.
  Adding "Read Holding Register" 108 function block in the Ladder Editor 109A in order to read the 4 integer values defined in the GV table of the slave, FIG. 11E, for:
    SLAVE_ID, same as defined in slave port settings
    SOURCE_ADDRESS, which is a Slave start address—(40000)
    LENGTH, which is no of registers to read
    DESTINATION_ADDRESS, which is a user assigned address of the master device that is to receive/transmit the message sent by the slave member
    SCAN_RATE
    COMM_ERR, which is an error status displayed when the master member and the slave member are mutually communicating.
  Adding 4 integer variables to store the value of 4 variables read from the slave member 15B.
  Giving a prescribed reference value of "&IB0" 110 in a "DESTINATION_ADDRESS" 111 of the GV table 106B, FIG. 11F.
  Adding "Read Coil Status" 112 register function block in the Ladder Editor 109B to read the 2 coil values defined in the slave member 15B, FIG. 11G.
  Adding variables
  Compiling a configured master application as above and a configured slave application as above
  Downloading the master application configuration into the master member and the slave application configuration into the slave member 15B.

FIG. 11H is a realistic and complete GV table 106C, while following table gives a various function block description.

| Signal | Data Type | Description |
|---|---|---|
| EN | BOOL | Enables block operation |
| H/I | BOOL | Set Register Type: 0 - Holding Register (% IB/% IW/% ID/% IL) TYPE) 1 - Input Register (% QB/% QW/% QD/% QL) TYPE) |
| SI | UINT | Set Slave identity number |
| SA | UINT | Set Slave start address |
| LEN | UINT | Set the Length |
| MA | UINT | Set Master start address |
| SR | UINT | Set Scan rate |
| ENO | BOOL | Indicates completion of operation |
| ERR | UINT | Set the Error value |

Figure 4B:
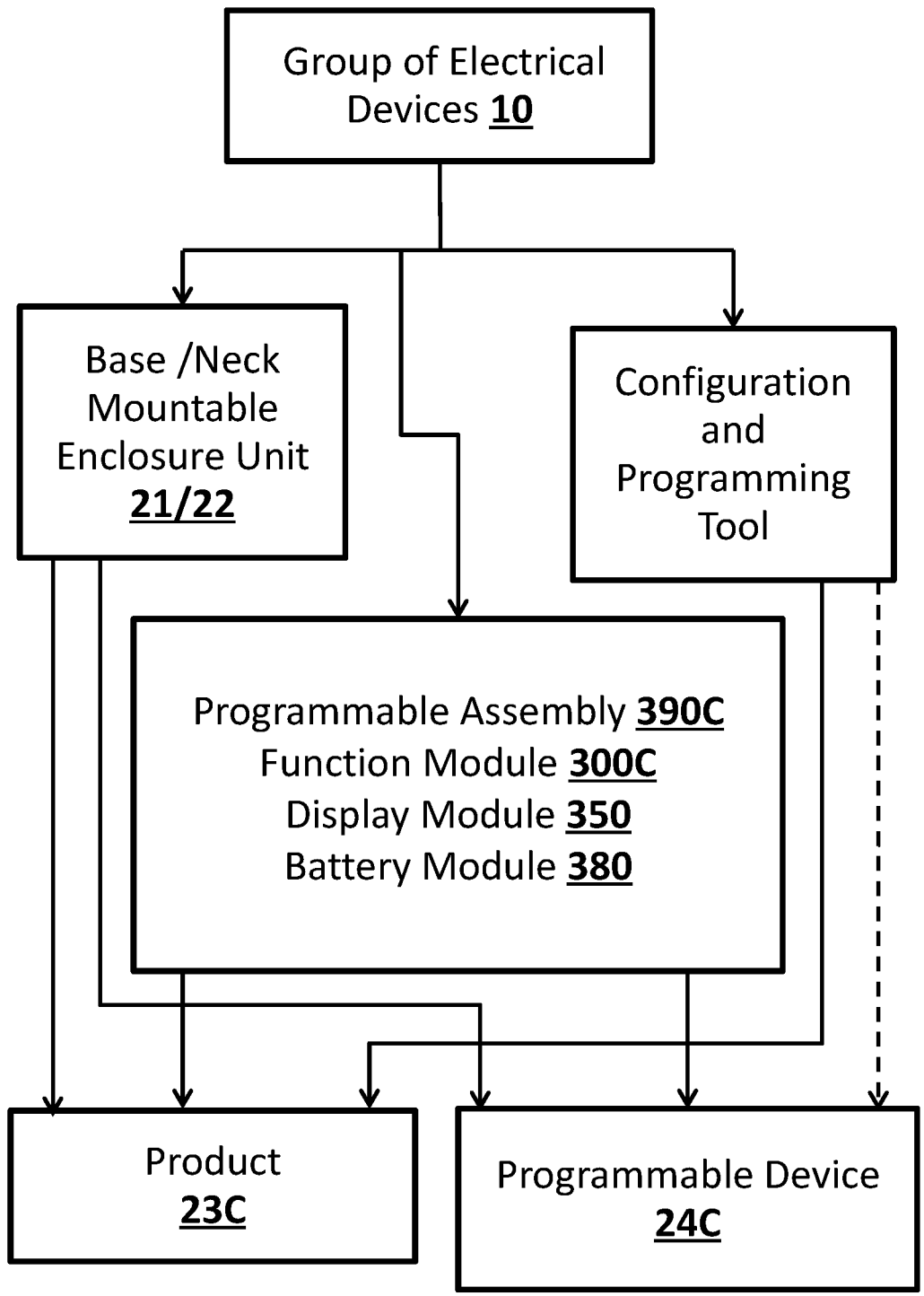

FIG. 4B, 5B, 5C, the member of group of electrical devices 10 is a wireless communication capable programmable device 24C wherein the function module 300 having a commensurate communication capability (WiFi and or Ethernet and or USB) is inserted in the type D module receptacle 480 which is adapted to accommodate such function module 300.

As a variation, a wireless programmable computing receptacle assembly 390C has the commensurate communication capability, whence the member of group of electrical devices 10 is a wireless communication capable product 23C.

The wireless communication capable programmable device 24C and the wireless communication capable product 23C interfaces with a contemporary smart phone 25 or a PC/Server 26 for a wireless management of
  Variable data, configuration parameters, display parameters
  Mail, SMS and such data as per set configuration
  Executable files FIG. 4, since the product 23 and the programmable device 24 as per present invention is hugely modular and configurable, a plurality of measures is built-in to safeguard the group of electrical devices 10 against inappropriate assembly, unauthorized disassembly and tamper.
  Connecting of the function module 300 with the programmable computing receptacle assembly 390, housed in a base mounted enclosure unit 21 or a neck mounted enclosure unit 22, is enabled only in one permissible manner ensuring that a set of plug-in male electrical connectors 312 of the function module 300 precisely engages till a defined depth with a corresponding set of plug-in female electrical connector 392 on the programmable computing receptacle assembly 390. FIG. 2, 3, 12.

Connecting the display module 350 with the programmable computing receptacle assembly 390, housed in a base mounted enclosure unit 21 or a neck mounted enclosure unit 22, is enabled only in an engaging orientation ensuring that a plug-in female electrical connector 353 of the display module 350 precisely engaging till a defined depth with a corresponding set of plug-in male electrical connector 393 on the programmable computing receptacle assembly 390.

Figure 14:
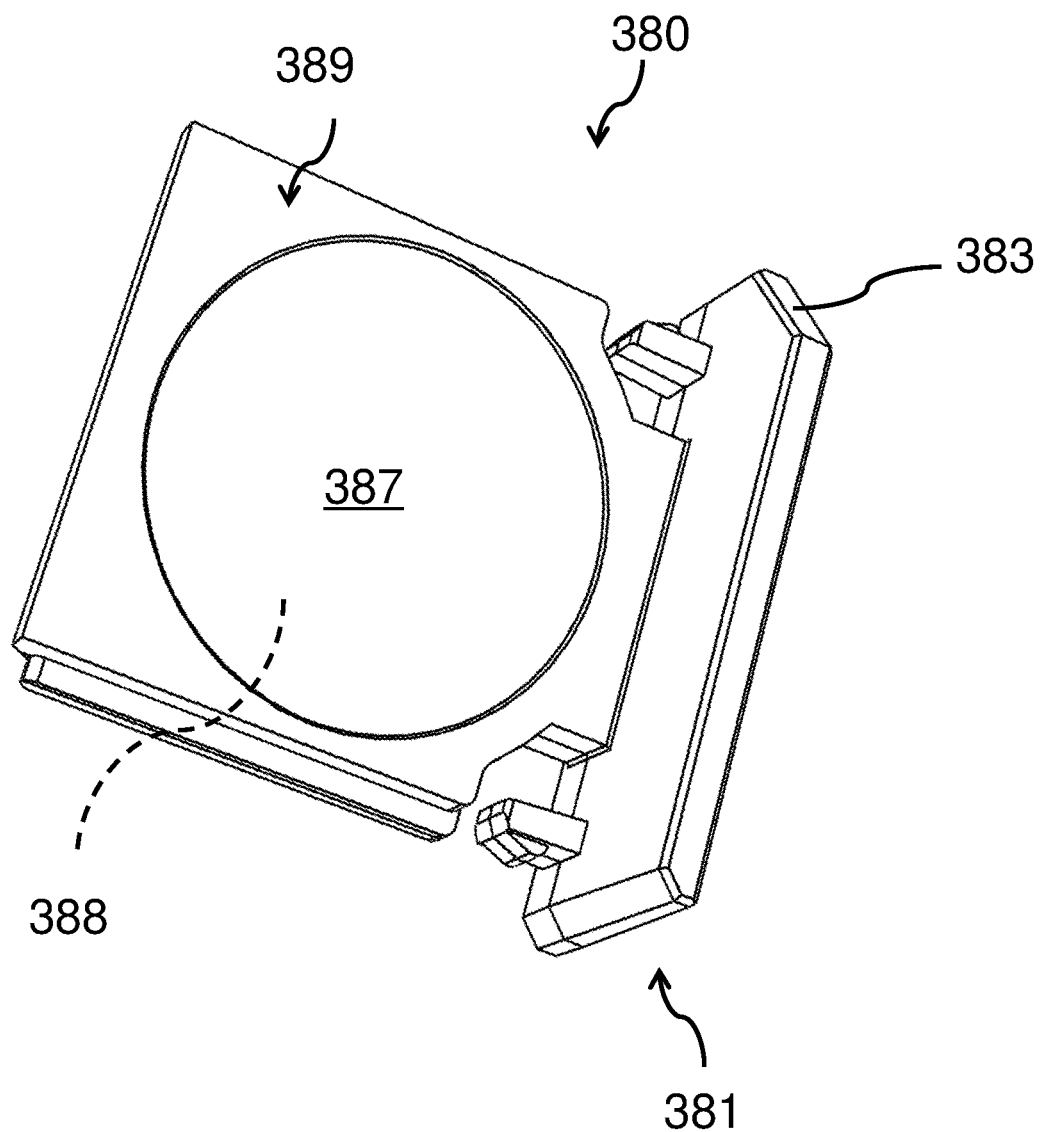
FIG. 14 is a perspective view of the battery module.

Connecting the battery module 380 with the programmable computing receptacle assembly 390, housed in a base mounted enclosure unit 21 or a neck mounted enclosure unit 22, is permissible only when a polarized module cover 383 is aligned with a corresponding seat, ensuring thus ensuring that a first contact surface 387 and the second contact surface 388 makes an electrical contact with a battery cell connector 395 on the programmable computing receptacle assembly 390 with a requisite contact pressure. FIG. 14.

Figure 13:
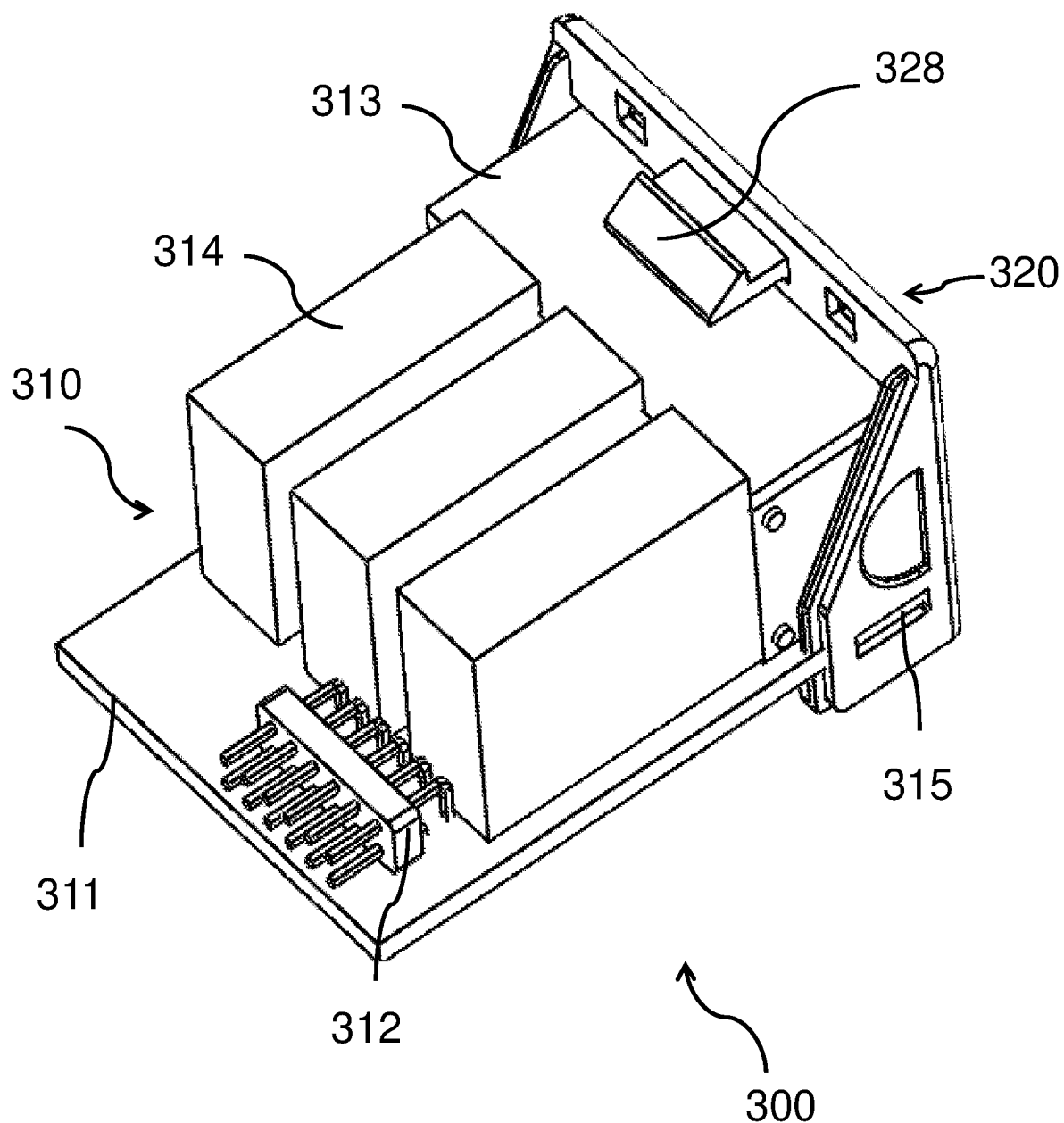
FIG. 13 is a perspective view of a function module.
Figure 15:
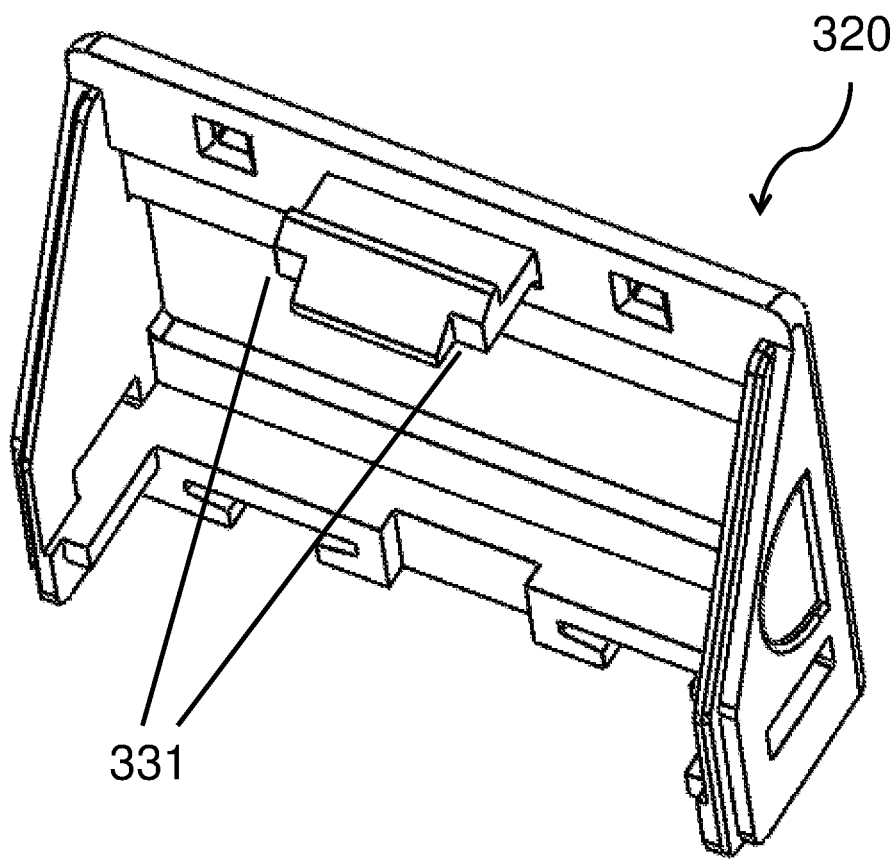
FIG. 15 is a perspective view of a fixation cap of the function module.
Figure 16:
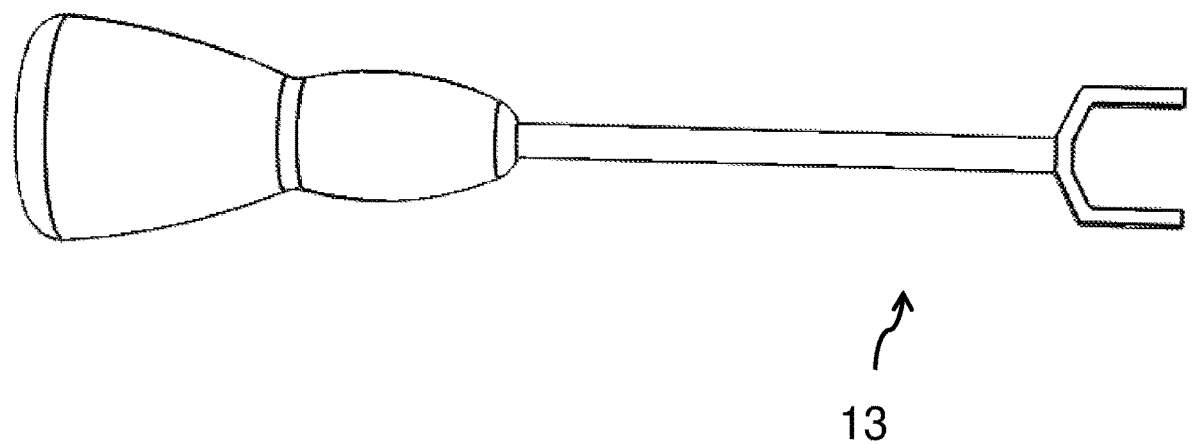
FIG. 16 is a side view of a fork type screwdriver.
Figure 17:
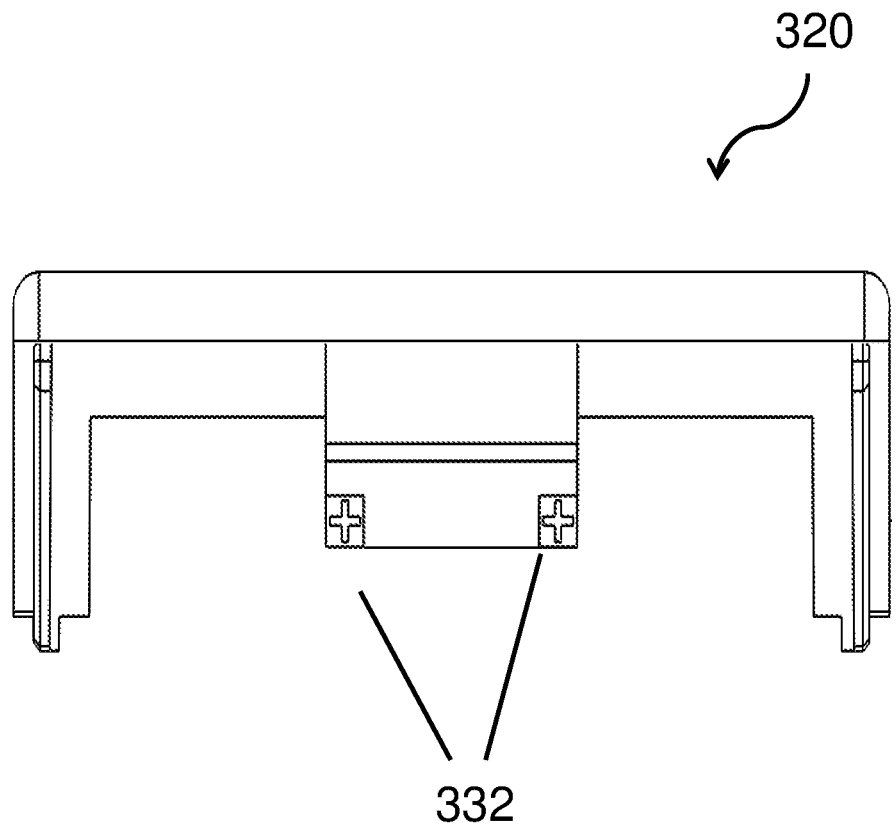
FIG. 17 is a front view of another embodiment of the fixation cap of the function module.

Removing or replacing the function module 300 involves an untrapping of the frontal locking means 328 of the function module 300, wherein the untrapping of the frontal locking means 328 is by a fine edge screwdriver or an equivalent sharp tool, FIG. 13. For situations where the removing or replacing the function module 300 is a supervisory function, FIG. 15 describes another embodiment wherein the fixation cap 320 has a pair of safety slots 331, and the untrapping is by a fork type screwdriver 13, FIG. 16. FIG. 17 describes yet another embodiment, wherein the untrapping is by a fork type tool with an untrapping profile complementary to a safety profile 332 provided on the fixation cap 320 of the function module 300.

Multi-level auto-expiring numeric/alpha-numeric passwords, retrievable from graphic user interface or from manufacturer when forgotten.

Figure 18:
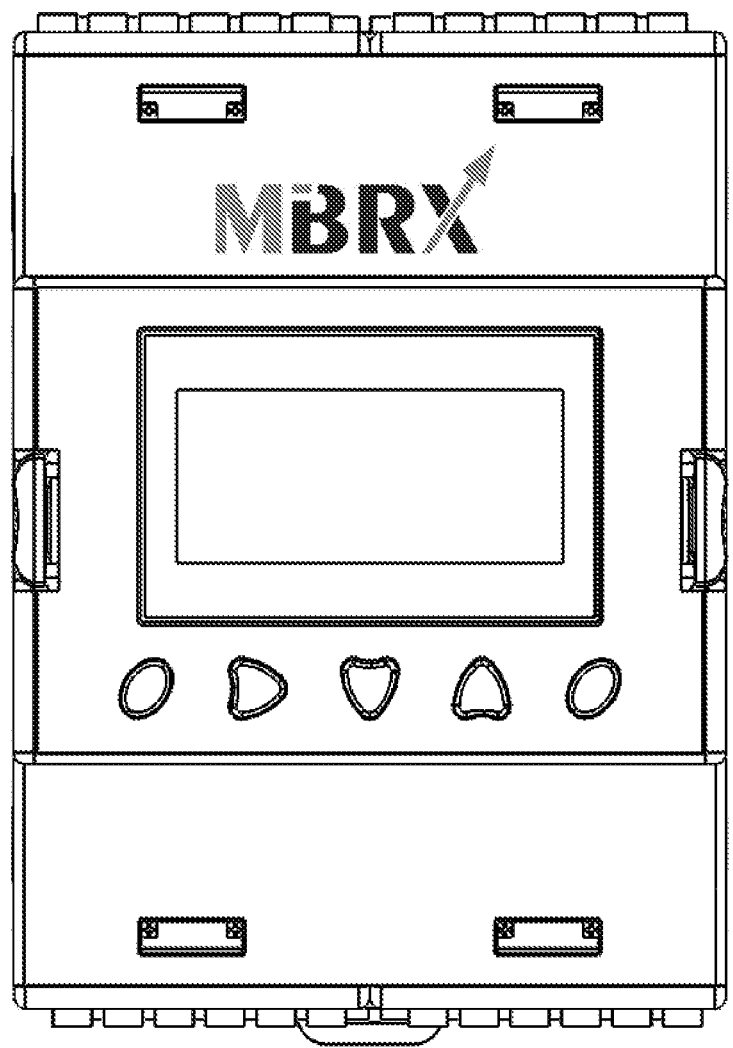
FIG. 18 is a front view of a member of the first sub-group.
Figure 19:
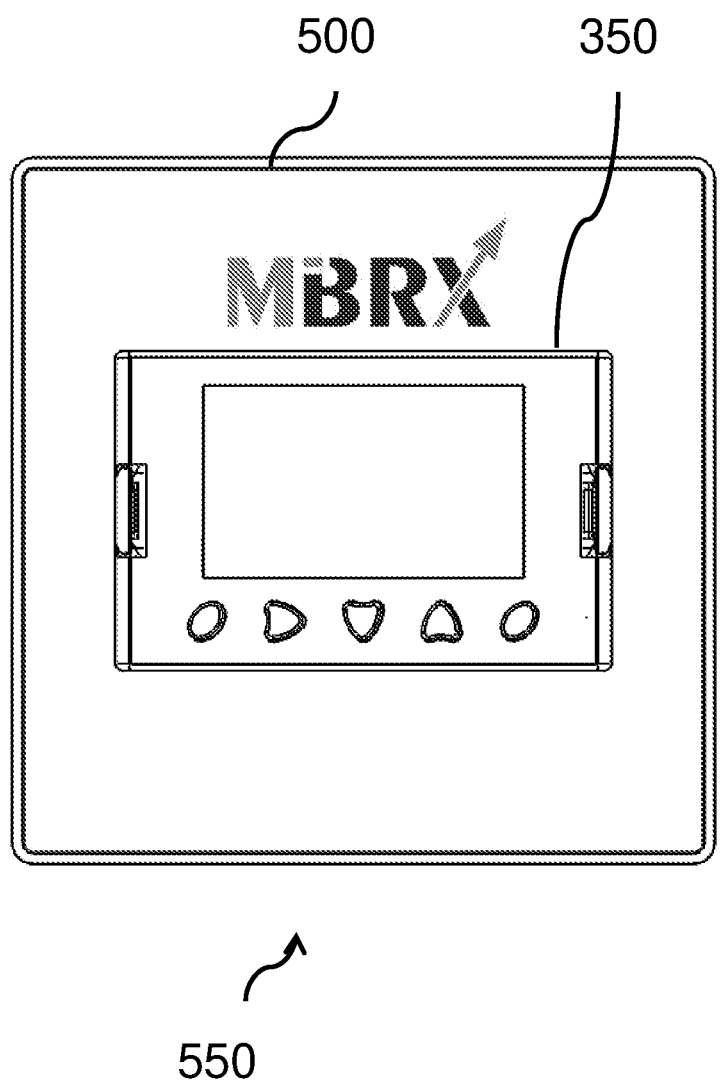
FIG. 19 is a front view of a member of the second sub-group.

FIG. 18, the member of the first sub-group 11 and FIG. 19, the member of the second sub-group 12, of the modular and configurable electrical device group 10 as per present invention is branded as

MBRX

We claim:

1. A modular and configurable group of electrical devices 10 for measurement, control and display of electrical and process parameters comprising a first sub-group 11 and a second sub-group 12, characterized in that
    each member 15 of the first sub-group 11 comprises a base mountable enclosure unit 21, a programmable computing receptacle assembly 390 and a plurality of function modules 300;
    each member 15 of the second sub-group 12 comprises a neck mountable enclosure unit 22, the programmable computing receptacle assembly 390 and the plurality of function modules 300; and
    each member 15 of electrical device has a display module 350 and optionally a battery module 380;
    wherein,
    a programming and configuration tool 100 is adopted to program and configure each member 15 of the first sub-group 11 and the second sub-group 12 as an application specific product 23 or as a programmable device 24;
    each member 15 of the first sub-group 11 and the second sub-group 12 is an independently configurable application specific electrical control device, each member 15 of the first sub-group 11 and the second sub-group 12 is a configurable application specific electrical control device as a slave or a master, in combination to a plurality of members of electrical device of the first sub-group 11 and the second sub-group 12;
    an application specific software concentrate 200 drives each member 15 of the group of electrical device 10 and is derived from a code generator 250 which converts a PLC compatible programming language 280 into the application specific software concentrate 200 such that execution time of a "while loop" of the application specific software concentrate 200 is minimal;
    an unused port of a micro-controller 399 is periodically force-set into an OUTPUT mode in a loop time less than one millisecond; and
    a plurality of electronic circuitry is architectured in a common mechanical design and a common electrical connectivity.

2. The modular and configurable group of electrical devices 10 as claimed in claim 1, wherein the programmable computing receptacle assembly 390 comprises a plurality of circuit boards 391 having at least a micro-controller 399 with associated electronic circuitry, a set of plug-in female electrical connectors 392, a set of plug-in male connectors 393, a set of wire-able connectors 394 and an optional battery cell connector 395.

3. The modular and configurable group of electrical devices 10 as claimed in claim 1, wherein the programmable computing receptacle assembly 390 comprises a set of minimal controlling means 400 having:
    a plurality of input points and a plurality of output points in a prescribed combination 410,
    an ambience sensing point 430, and
    a communication transceiver 440,
    at least one type A module receptacle 450, and or
    at least one type B module receptacle 460, and
    a display module receptacle 490.

4. The modular and configurable group of electrical devices 10 as claimed in claim 1, wherein the programmable computing receptacle assembly 390 comprises a set of minimal controlling means 400 having
    a plurality of input points and a plurality of output points in a prescribed combination 410,
    an ambience sensing point 430,
    a communication transceiver 440,
    at least one type A module receptacle 450, and or
    at least one type B module receptacle 460, and or
    at least one type C module receptacle 470, and or
    at least one type D module receptacle 480, and or
    a display module receptacle 490.

5. The modular and configurable group of electrical devices 10 as claimed in claim 3 or 4, wherein each of the type A module receptacle 450, the type B module receptacle 460, the type C module receptacle 470, and the type D module receptacle 480 has an identical number of prescribed electrical connecting points on the set of plug-in female electrical connector 392.

6. The modular and configurable group of electrical devices 10 as claimed in claim 5, wherein the type D module receptacle 480 has an extended number of electrical connecting points, besides the identical numbers of prescribed electrical connecting points so as to accept the function module 300 with the prescribed electrical connecting points and/or the function module 300 with the extended numbers of electrical connecting points.

7. The modular and configurable group of electrical devices 10 as claimed in claim 3 or 4, wherein the type A module receptacle 450 is adapted to accommodate the function module 300 which has any combination of following which require a prescribed number of electrical connecting points:
  Plurality of digital inputs, and or
  Plurality of high-speed digital inputs, and or
  Plurality of relay and/or transistor outputs, and/or
  Plurality of high-speed digital outputs, and/or
  Plurality of analogue outputs, and/or
  Plurality of analogue inputs, and or
  Plurality of load cell inputs, and or
  Plurality of AC voltage or current inputs.

8. The modular and configurable group of electrical devices 10 as claimed in claim 3 or 4, wherein the type B module receptacle 460 is adapted to accommodate the function module 300 which has any combination of following which require a prescribed number of electrical connecting points:
  Plurality of digital inputs, and or
  Plurality of high-speed digital inputs, and or
  Plurality of relay and/or transistor outputs, and or
  Plurality of high-speed digital outputs, and or
  Plurality of analogue outputs, and or
  Plurality of analogue inputs, and or
  Plurality of load cell inputs, and or
  Plurality of AC voltage or current inputs, and or
  At least a data logging input.

9. The modular and configurable group of electrical devices 10 as claimed in claim 4, wherein the type C module receptacle 470 is adapted to accommodate the function module 300 which has any combination of following which require a prescribed number of electrical connecting points, subject to a capacity of the micro-controller 399 of the programmable computing receptacle assembly 390:
  Plurality of digital inputs, and or
  Plurality of relay and/or transistor outputs, and or
  Plurality of analogue outputs, and or
  Plurality of analogue inputs, and or.

10. The modular and configurable group of electrical devices 10 as claimed in claim 4, wherein the type D module receptacle 480 is adapted to accommodate the function module 300 which has any combination of following which require a prescribed number of electrical connecting points, subject to a capacity of the micro-controller 399 of the programmable computing receptacle assembly 390:
  Plurality of digital inputs, and or
  Plurality of relay and/or transistor outputs, and or
  Plurality of analogue inputs, and or
  A communication port.

11. The modular and configurable group of electrical devices 10 as claimed in claim 4, wherein the module receptacles 450, 460, 470 and 480 are mechanically identical but electrically different.

12. The modular and configurable group of electrical devices 10 as claimed in claim 4, wherein the function module 300 suited to functions of the type D module receptacle 480 can also be disposed in the type C module receptacle 470, also in the type B module receptacle 460 and also in the type A receptacle 450.

13. The modular and configurable group of electrical devices 10 as claimed in claim 4, wherein the function module 300 suited to functions of the type C module receptacle 470 can also be disposed in the type B module receptacle 460, also in the type A module receptacle 450.

14. The modular and configurable group of electrical devices 10 as claimed in claim 1, wherein the function module 300 is provided with a barrel shifter 301 and or a slave intelligence 302, increasing an effective number of ports of a micro-controller 399 of the programmable computing receptacle assembly 390.

15. The modular and configurable group of electrical devices 10 as claimed in claim 1, wherein the function module 300 has external to itself an independently disposable driving module 300D, comprising a receiver with a driver to drive a final element, like a contractor on a relay.

16. The modular and configurable group of electrical devices 10 as claimed in claim 1, wherein the more than one member of electrical device of the first sub-group 11 and / or the sub-group 12 are a master member 15A and a slave member 15B with an RS485 port of the master member 15A and an RS485 port of the slave member 15B mutually connected.

17. The modular and configurable group of electrical devices 10 as claimed in claim 1, wherein the programming and configuration tool 100 in the form of a computer program, named "SELPRO" is deployed to program and configure the programmable computing receptacle assembly 390, the programming and configuration comprising the gross steps of:
  Selecting a product 23 from a drop-down menu "New Project" 101;
  Selecting the function module 300;
  Selecting the display module 350;
  Creating a ladder diagram for a control logic of respective function modules 300;
  Simulating an execution of the ladder diagram, and
  Customizing a user interface from a generic interface.

18. The modular and configurable group of electrical devices 10 as claimed in claim 4, wherein the member 15 of group of electrical devices 10 is a wireless communication capable programmable device 24C wherein a function module 300C having a commensurate communication capability (WiFi and or Ethernet and or USB) is inserted in the type D module receptacle 480 which is adapted to accommodate such function module 300C, the wireless communication capable programmable device 24C interfaces with a contemporary smart phone 25 or a PC/Server 26 for a wireless management of
  Variable data, configuration parameters, display parameters,
  Electronic mail, SMS and such data as per set configuration, and
  Executable files.

19. The modular and configurable group of electrical devices 10 as claimed in claim 1, wherein the member 15 of group of electrical devices 10 is a wireless communication capable product 23C wherein a wireless programmable computing receptacle assembly 390C has a commensurate communication capability (WiFi and or Ethernet and or USB), the wireless communication capable product 23C interfaces with a contemporary smart phone 25 or a PC/Server 26 for a wireless management of
  Variable data, configuration parameters, display parameters,
  Electronic Mail, SMS and such data as per set configuration,
  Executable files.

20. A process of securely preparing a member of a first sub-group 11 or a member of a second sub-group 12 of a modular and configurable group of electrical device 10, comprising:
  Connecting a function module 300 with a programmable computing receptacle assembly 390, housed in a base mounted enclosure unit 21 or a neck mounted enclosure unit 22, enabled only in one permissible manner ensuring that a set of plug-in male electrical connectors 312 of the function module 300 precisely engages till a defined depth with a corresponding set of plug-in female electrical connector 392 on the programmable computing receptacle assembly 390;

Connecting of a display module 350 with the programmable computing receptacle assembly 390, housed in the base mounted enclosure unit 21 or the neck mounted enclosure unit 22, enabled only in an engaging orientation ensuring that a plug-in female electrical connector 353 of the display module 350 precisely engaging till a defined depth with a corresponding set of plug-in male electrical connector 393 on the programmable computing receptacle assembly 390;

Connecting of the battery module 380 with the programmable computing receptacle assembly 390, housed in a base mounted enclosure unit 21 or a neck mounted enclosure unit 22, permissible only when a polarized module cover 383 is aligned with a corresponding seat, ensuring thus ensuring that a first contact surface 387 and the second contact surface 388 makes an electrical contact with a battery cell connector 395 on the programmable computing receptacle assembly 390 with a requisite contact pressure; and Setting up of a multi-level auto-expiring numeric/alphanumeric passwords, retrievable from graphic user interface or from manufacturer when forgotten.

21. The process of securely preparing the member as claimed in claim 20, wherein the preparing process of removing or replacing the function module 300 involves an untrapping of the frontal locking means 328 of the function module 300, while simultaneously steering the function module 300 out of a base mounted enclosure unit 21 or a neck mounted enclosure unit 22.

22. The process of securely preparing the member 15 as claimed in claim 21, wherein the untrapping is by a fork type screwdriver 13.

23. The process of securely preparing the member 15 as claimed in claim 21, wherein the untrapping is by a fork type tool with an untrapping profile complementary to a safety profile 332 provided on a fixation cap 320 of the function module 300.

* * * * *